US012593621B2

(12) United States Patent
Chen et al.

(10) Patent No.: US 12,593,621 B2
(45) Date of Patent: Mar. 31, 2026

(54) PHASE CHANGE MULTILAYER HETEROSTRUCTURE WITH MULTIPLE HEATERS

(71) Applicant: INTERNATIONAL BUSINESS MACHINES CORPORATION, Armonk, NY (US)

(72) Inventors: Ching-Tzu Chen, Ossining, NY (US); Kevin W. Brew, Niskayuna, NY (US); Jin Ping Han, Yorktown Heights, NY (US); Timothy Mathew Philip, Albany, NY (US); Injo Ok, Loudonville, NY (US)

(73) Assignee: International Business Machines Corporation, Armonk, NY (US)

( * ) Notice: Subject to any disclaimer, the term of this patent is extended or adjusted under 35 U.S.C. 154(b) by 697 days.

(21) Appl. No.: 17/929,330

(22) Filed: Sep. 2, 2022

(65) Prior Publication Data

US 2024/0081159 A1 Mar. 7, 2024

(51) Int. Cl.
H10N 70/20 (2023.01)
H10B 63/00 (2023.01)
H10N 70/00 (2023.01)

(52) U.S. Cl.
CPC ........... H10N 70/231 (2023.02); H10B 63/80 (2023.02); H10N 70/021 (2023.02); (Continued)

(58) Field of Classification Search
CPC .. G11C 14/0045; G11C 14/009; H10B 63/10; H10B 63/24
See application file for complete search history.

(56) References Cited

U.S. PATENT DOCUMENTS 7,560,721 B1 7/2009 Breitwisch
7,829,878 B2 11/2010 Sato
(Continued)

FOREIGN PATENT DOCUMENTS

CN 105489757 B 7/2018
KR 100960461 B1 5/2010

OTHER PUBLICATIONS

Pending U.S. Appl. No. 17/653,143, filed Mar. 2, 2022, entitled: "Phase Change Memory Cell With Double Active Volume", 48 pages.

*Primary Examiner* — Han Yang
(74) *Attorney, Agent, or Firm* — Teddi Maranzano

(57) ABSTRACT

A structure including alternating layers of phase change material layers and dielectric encapsulated heater element layers, the alternating layers of phase change material layers and the dielectric encapsulated heater element layers are sandwiched between a first electrode and a second electrode. A structure including horizontally aligned alternating layers of phase change material layers and dielectric encapsulated heater element layers, the alternating layers of phase change material layers and the dielectric encapsulated heater element layers are sandwiched between a first electrode and a second electrode. A method including forming alternating layers of phase change material layers and dielectric encapsulated heater element layers, the alternating layers of phase change material layers and the dielectric encapsulated heater element layers are sandwiched between a first electrode and a second electrode.

19 Claims, 15 Drawing Sheets

200

Section X-X

(52) U.S. Cl.
CPC ....... *H10N 70/061* (2023.02); *H10N 70/8413*
(2023.02); *H10N 70/8613* (2023.02)

(56) References Cited

U.S. PATENT DOCUMENTS

| | | | |
|---|---|---|---|
| 7,923,712 B2 | 4/2011 | Arnold | |
| 7,989,920 B2 | 8/2011 | Lee | |
| 8,236,602 B2 | 8/2012 | Chang | |
| 8,471,236 B2 | 6/2013 | Breitwisch | |
| 9,196,530 B1 | 11/2015 | Tortorelli | |
| 2011/0155993 A1* | 6/2011 | Chen | H10N 70/8828 438/102 |
| 2021/0320250 A1* | 10/2021 | Heiss | H10N 70/823 |
| 2022/0285614 A1* | 9/2022 | Li | H10N 70/068 |

* cited by examiner

100

106

X              X

104

100

106

104

102

Section X-X

100

108

100

108

106

104

102

Section X-X

100

100

Section X-X

100

100

Section X-X

100

100

Section X-X

100

100

Section X-X

200

200

Section X-X

300

300

Section X-X

300

306D
306E
306F 306A
306B
306C

316

300

306C
306B
306A 306D
306E
306F 316 316 316 316 316 316 316

304

302

Section X-X

Section X-X

Section X-X

300

300

Section X-X

Section X-X

PHASE CHANGE MULTILAYER HETEROSTRUCTURE WITH MULTIPLE HEATERS

BACKGROUND

The present invention relates generally to a phase change memory cell, and more particularly, to a phase change material memory cell with heterostructure phase change material sandwiched with single or multiple heaters between two electrodes.

A phase change material memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

SUMMARY

According to an embodiment of the present invention, a structure is provided. The structure may include alternating layers of phase change material layers and dielectric encapsulated heater element layers, the alternating layers of phase change material layers and the dielectric encapsulated heater element layers are sandwiched between a first electrode and a second electrode.

According to an embodiment of the present invention, a structure is provided. The structure may include horizontally aligned alternating layers of phase change material layers and dielectric encapsulated heater element layers, the alternating layers of phase change material layers and the dielectric encapsulated heater element layers are sandwiched between a first electrode and a second electrode.

According to an embodiment of the present invention, a method is provided. The method may include forming alternating layers of phase change material layers and dielectric encapsulated heater element layers, the alternating layers of phase change material layers and the dielectric encapsulated heater element layers are sandwiched between a first electrode and a second electrode.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
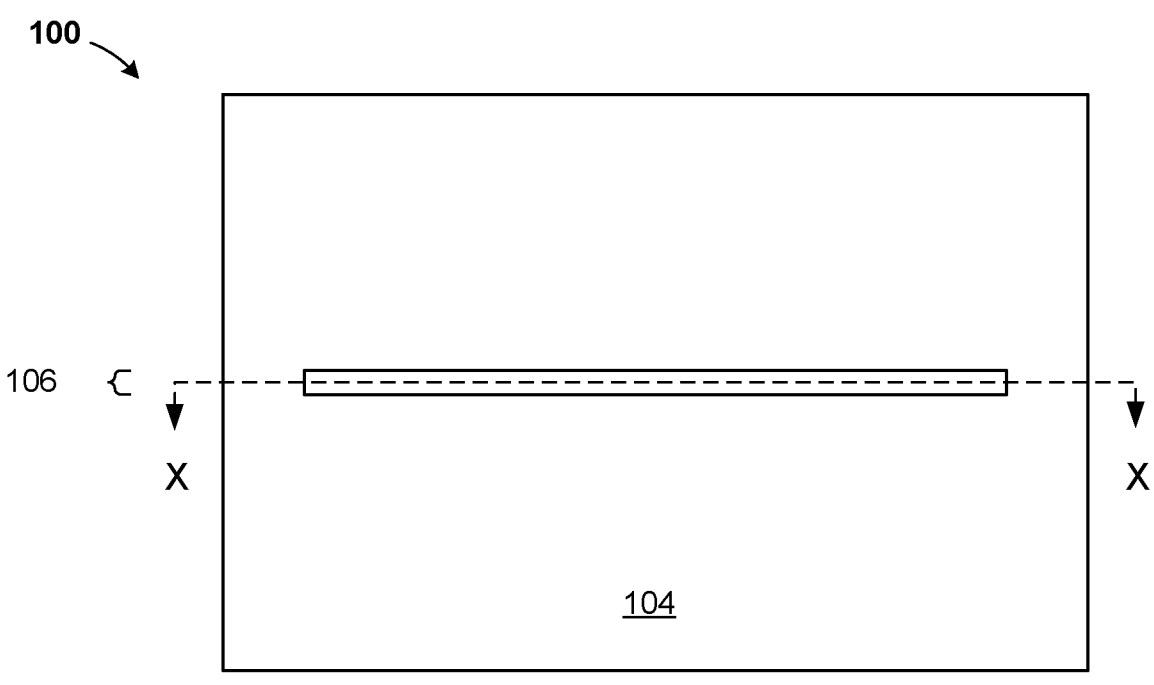
FIG. 1 illustrates a top view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a phase change memory cell, and more particularly, to a heterostructure phase change material sandwiched with single or multiple heaters between two electrodes.

As stated above, a typical configuration of a phase change memory cell may include a phase change material arranged between, and coupled to, at least two electrodes. A first contact and a second contact may each be connected to one of the two electrodes. The phase change material may be used as a phase change memory which stores data by controlling a resistive state of the phase change material. A low resistive state has the phase change material fully crystallized. A high resistive state has amorphized phase change material. The phase change material may be amorphized by supplying energy to the phase change material such as, for example, electrical energy, thermal energy, any other suitable form of energy or combination thereof that may effectuate a desired phase transition. For example, a current pulse may be applied to a heater electrode embedded in dielectric layers connected to the phase change material layer. For more than two memory states, such as for analog computing, an amount of amorphous volume may be controlled for a continuum of resistance states which can be programmed.

As the phase change material has energy supplied to change to an amorphized state, the portions of the phase change material which become amorphized typically become amorphized starting where the current pulse is applied and spreading out in a 'mushroom shape'. This results in a semicircle or mushroom shape portion of amorphized phase change material and a remaining portion of crystalized phase change material. This memory cell may be referred to as a mushroom cell. Mushroom cells exhibit read bias polarity asymmetry. Measuring a resistance of a mushroom cell may vary dependent upon a polarity of a read voltage applied resulting in different values. The polarity dependence of the mushroom cell limits the speed, power efficiency and accuracy of neuromorphic computing using phase change memory cells. Neuromorphic computing or neuromorphic engineering is used in artificial intelligence.

A current pulse for resetting a mushroom cell to the high resistance amorphized state may require 400 microamperes of current. Minimizing the footprint of the access transistors demands reducing the reset current as much as possible. However, decreasing the programming current below 200 microamperes requires patterning the heater electrode to a very small dimension, which impacts the device yield and aggravates the device-to-device variability.

A device with multiple layers of phase change material each separated with a dielectric encapsulated heater element is proposed to address these problems. The proposed device has reduced programming current due to improved thermal confinement from each layer of phase change material with each heater element, and has lower power consumption during analog computing due to higher SET/RESET resistance of structure to change to and from an amorphized and crystalized state. The heater element is directly connected to the surrounding phase change material layers.

The dielectric encapsulates the heater element above, below and two vertical side surfaces of the heater element. Two remaining vertical side surfaces of the heater element may be adjacent to a phase change material layer. Alternatively, one remaining vertical side surface of the heater element may be adjacent to a phase change material layer and one remaining vertical side surface of the heater element may be adjacent to an electrode. In a second embodiment, the dielectric encapsulates the heater element on four vertical side surfaces of the heater element. An upper surface and a lower surface of the heater element may be adjacent to a phase change material layer. Alternatively, either the upper or lower surface of the heater element may be adjacent to a phase change material layer and one remaining either upper or lower surface of the heater element may be adjacent to an electrode.

The resulting structure is read symmetric and has a lower write current due to a symmetric device structure that sandwiches each PCM layer with the dielectric encapsulated heaters at two sides, which doubles the heating for a given current and reduces heat loss.

The dielectric encapsulated heater element can be patterned and helps decrease a write current due to 2 mechanisms. The two mechanisms include heating each PCM layer from both sides with aligned heaters and better thermal confinement.

The heater element can be formed by patterning metallic nanowires, which are then encapsulated within a dielectric. Alternatively, the heater element can be formed by patterning a high-k dielectric segment in a non-filamentary dielectric, followed by a dielectric breakdown to form a filamentary heater in the high-k dielectric. The heater element is directly adjacent to the surrounding phase change material layers.

In an embodiment, there may be any number of alternating layers of phase change material layers and layers of dielectric encapsulated heater elements between a pair of electrodes for an individual cell. In an embodiment, the phase change material layers may be adjacent to the pair of electrodes, which may reduce heat loss. In an alternate embodiment, the layers of dielectric encapsulated heater elements may be adjacent to the pair of electrodes.

In an embodiment, the high-k dielectric segment may be subjected to a one-time high voltage, for example, a 1V to 1.5V for each layer of high-k dielectric segment in a non-filamentary dielectric. For example, an individual cell with 3 layers of high-k dielectric segment in a non-filamentary dielectric may be require approximately 4-5 V across the pair of electrodes to produce a breakdown in each portion of the high-k dielectric. The portion of the high-k dielectric which breaks down forms the heater elements of the individual cell. In an embodiment, the one-time high voltage to break down a portion of the high-k dielectric may be reduced by heating up the device. Additionally, the one-time high voltage to break down a portion of the high-k dielectric may be reduced by performing a plasma pre-treatment of the high-k dielectric prior to encapsulation. A material of encapsulating dielectric may be selected which may not be damaged by the one-time high voltage. The one-time high voltage required may be controlled by various methods as indicated. An advantage of using a blanket film as the high-k dielectric segment in a non-filamentary dielectric may be this device is easier to manufacture than the dielectric encapsulated metallic nanowires. This is true only when the high-k dielectric layer is a blanket film.

An advantage of using the dielectric encapsulated metallic nanowires is the heaters may be aligned across the individual device. Alternatively, the breakdown of the blanket film high-k dielectric segment may not result in heaters aligned across the individual device. The high-k dielectric segment may be patterned to form aligned filamentary heaters. An advantage of having the heaters aligned is a compound heating effect when heating the heaters to change a state of the phase change material, requiring a significantly smaller amount of current to fully change the state. If the heaters are not aligned, the compound heating effect would be reduced, as the heated areas of the phase change material may not overlap unless the heated areas are large enough. In an example, a current reduction is greater than 50%, compared to unaligned heaters.

In an embodiment, the alternating layers of phase change material layers and layers of dielectric encapsulated heater elements between a pair of electrodes may be formed horizontally. In an alternate embodiment, the alternating layers of phase change material layers and layers of dielectric encapsulated heater elements between a pair of electrodes may be formed vertically.

In an embodiment, additional layers may be formed surrounding the dielectric encapsulated heater elements layers and/or the phase change material layers. The additional layers may include one or more layers and may include a thermal barrier layer, an adhesion layer, and a projection liner which reduces programming current and drift.

The resulting device has reduced programming current due to improved thermal confinement from phase change material and has lower power consumption during analog computing. The device will enable bi-directional read operation, such that the individual cell can be read in either direction, saving time and power to read the device.

In an artificial intelligence application, a resistance of the device corresponds to a weight that can be positive or negative. The positive component of the weight on the device may be labeled G+ and the negative component of the weight on the device may be labeled G−. If there is no asymmetry in the device, both devices can be read simultaneously by applying a positive voltage to one device, a negative voltage to the other device, and allowing the currents to cancel. This can increase the speed and energy efficiency of the architecture. The resulting device may be used in such an application.

A method of forming a phase change material memory cell with hetero structure phase change material sandwiched with single or multiple heaters sandwiched between electrodes is described in detail below by referring to the accompanying drawings in FIGS. 1-28, in accordance with an illustrative embodiment.

Figure 2:
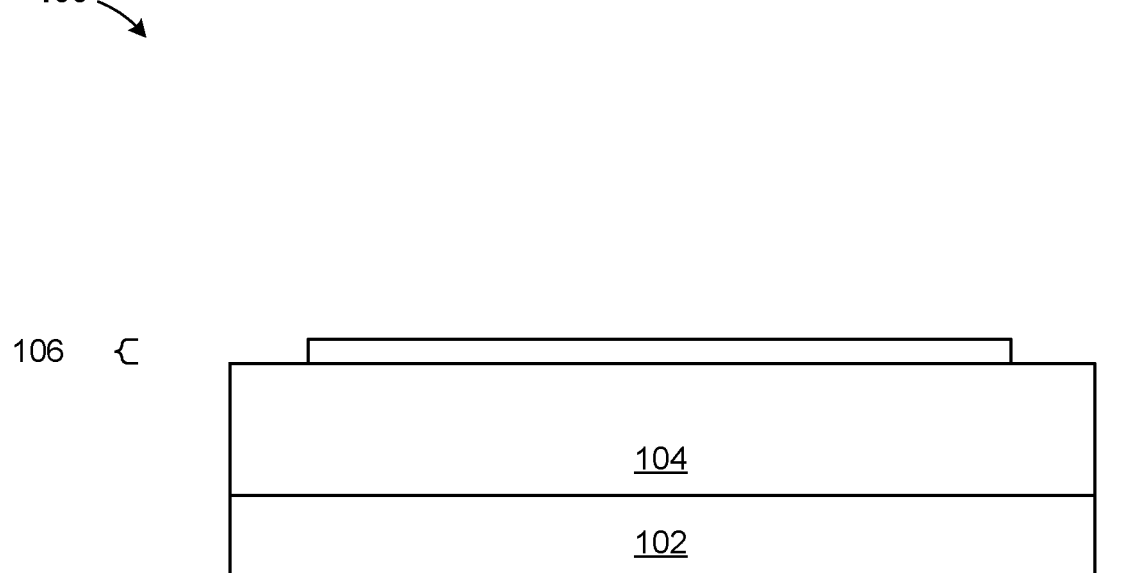
FIG. 2 illustrates a cross-sectional view of the semiconductor structure of FIG. 1, according to an exemplary embodiment.

Referring now to FIGS. 1 and 2, a semiconductor structure (hereinafter "structure") 100 is shown at an intermediate step of fabrication, according to an embodiment. FIG. 1 is a top view of the structure 100. FIG. 2 is a cross-sectional view of the structure 100 along section line X-X. The structure 100 may include a stack of layers formed on top of a substrate 102 and subsequently patterned into individual cells. The structure 100 includes, for example, the substrate 102, a dielectric layer 104, and a nanowire 106.

The substrate 102 may be a silicon substrate with connections and structures, such as, for example, transistors and isolations built on it. The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The dielectric layer 104 can be deposited across the top of the structure 100 in a blanket layer using any known deposition techniques, such as, for example, chemical vapor deposition, atomic layer deposition, physical layer deposition, or some combination thereof. The dielectric layer 104 may include materials, such as, for example, an oxide, a nitride, or some combination thereof. In an embodiment, the dielectric layer 104 may include an oxide, such as, silicon oxide. In an alternate embodiment, the dielectric layer 104 may include a nitride, such as, silicon nitride. A chemical mechanical planarization technique may optionally be used to polish the dielectric layer 104 and provide a substantially smooth and uniform surface in preparation for subsequent processing techniques. The dielectric layer 104 may include a material with a dielectric constant less than or equal to 5.0.

The nanowire 106 may be a metallic nanowire or a bundle of carbon nanotubes. The nanowire 106 may include carbon. The nanowire 106 may be formed by E-beam lithography, extreme ultraviolet (EUV) or patterning the nanowire 106 on the dielectric layer 104.

The nanowire 106 may be formed in a line. For example, the nanowire may have a diameter between 3 and 100 nanometers.

Figure 3:
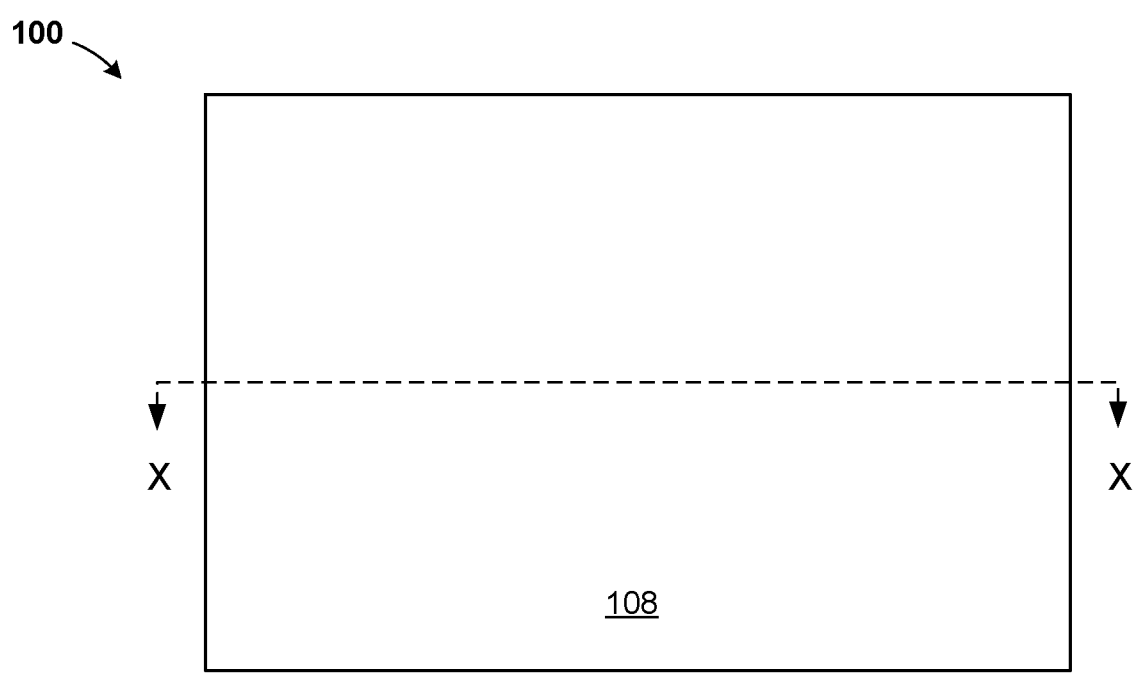
FIGS. 3 and 4 illustrate a top view and a cross-sectional view of the semiconductor structure, respectively, and illustrate forming a dielectric, according to an exemplary embodiment.
Figure 4:
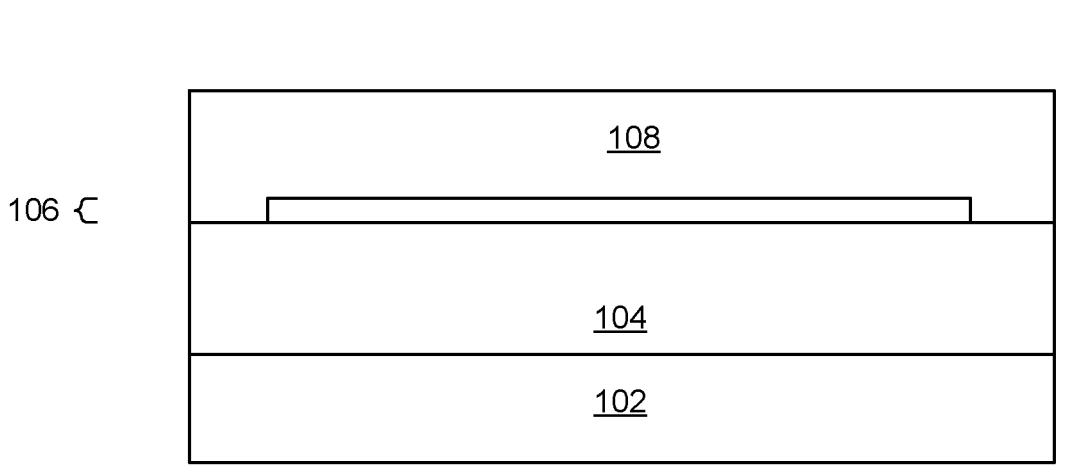

Referring now to FIGS. 3 and 4, the structure 100 is shown, according to an embodiment. FIG. 3 is a top view of the structure 100. FIG. 4 is a cross-sectional view of the structure 100 along section line X-X. A dielectric layer 108 may be formed.

The dielectric layer 108 may be formed as described for the dielectric layer 104. In an embodiment, the dielectric layer 108 includes a hard mask. The dielectric layer 108 may have a height between 10 and 250 nanometers. The dielectric layer 108 may have a width between 3 and 50 nanometers.

Figure 5:
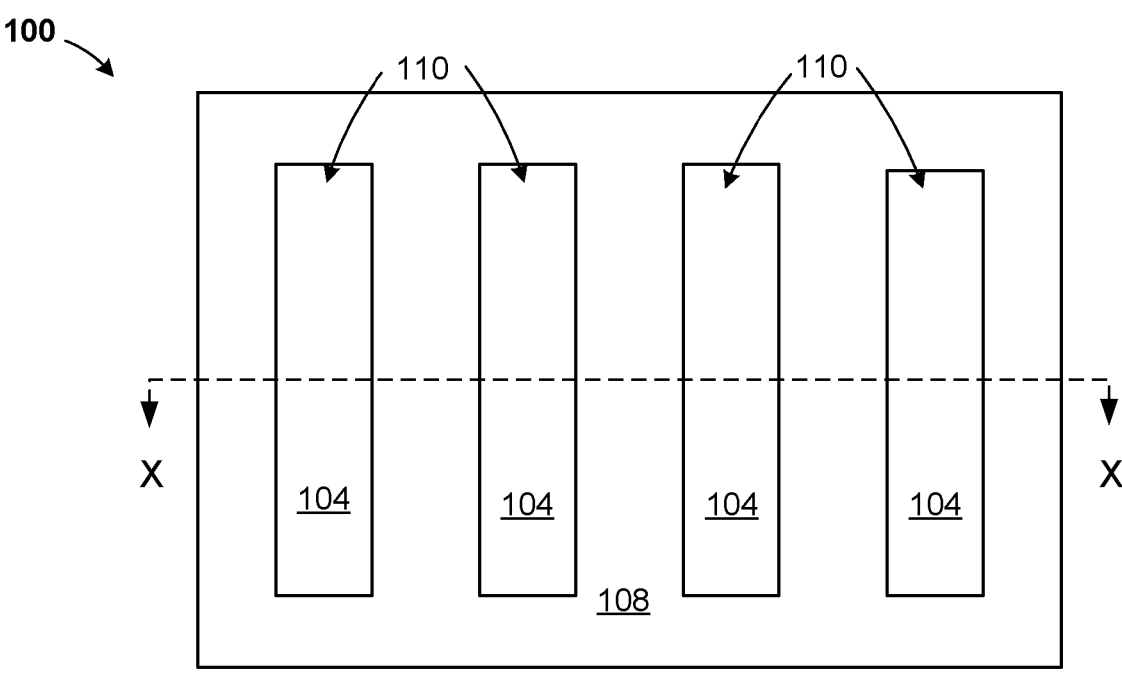
FIGS. 5 and 6 illustrate a top view and a cross-sectional view of the semiconductor structure, respectively, and illustrate forming an opening, according to an exemplary embodiment.
Figure 6:
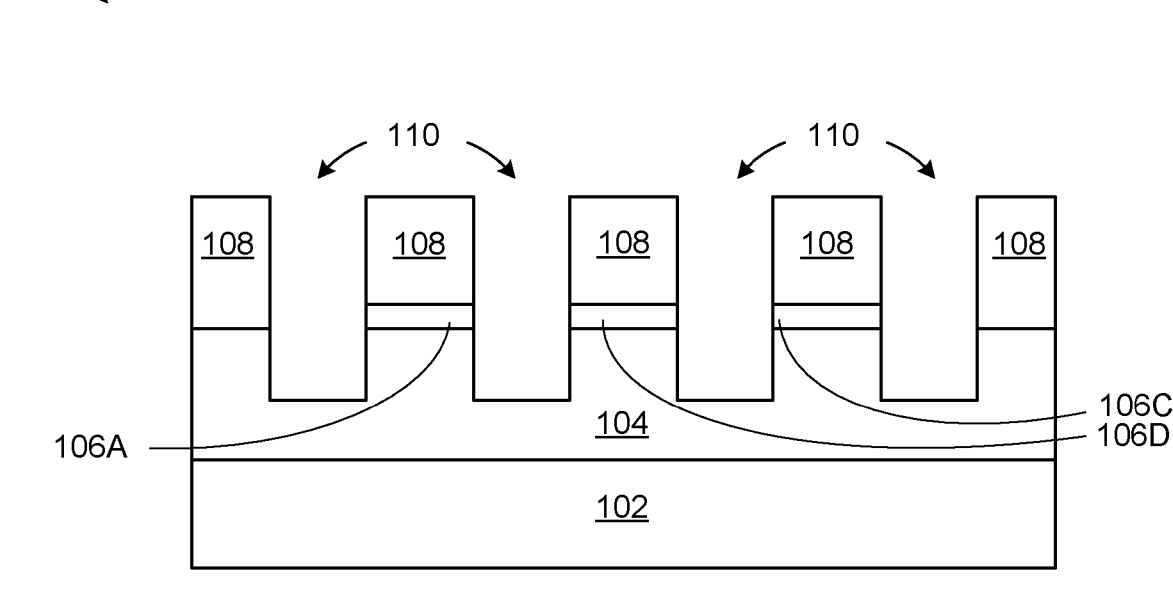

Referring now to FIGS. 5 and 6, the structure 100 is shown, according to an embodiment. FIG. 5 is a top view of the structure 100. FIG. 6 is a cross-sectional view of the structure 100 along section line X-X. Openings 110 may be formed.

Portions of the dielectric layer 108 may be removed and portions of the dielectric layer 104 may be removed when forming the openings 110. The openings 110 may have exposed vertical side surfaces and a portion of an upper surface of the dielectric layer 104. Vertical side surfaces of the dielectric layers 108 may be exposed. The nanowire 106 may have portions removed, resulting in remaining portion of the nanowire 106 identified as nanowires 106A, 106B and 106B. Vertical side surfaces of the nanowires 106A, 106B and 106C may be exposed in the openings 110. The openings 110 may be formed by methods known in the arts. There are 4 openings 110 shown in FIGS. 5 and 6. There may be any number of openings 110 in the structure 100. The nanowires 106A, 106B, 106C may each have a length between 3 and 50 nanometers long along section line X-X.

Figure 7:
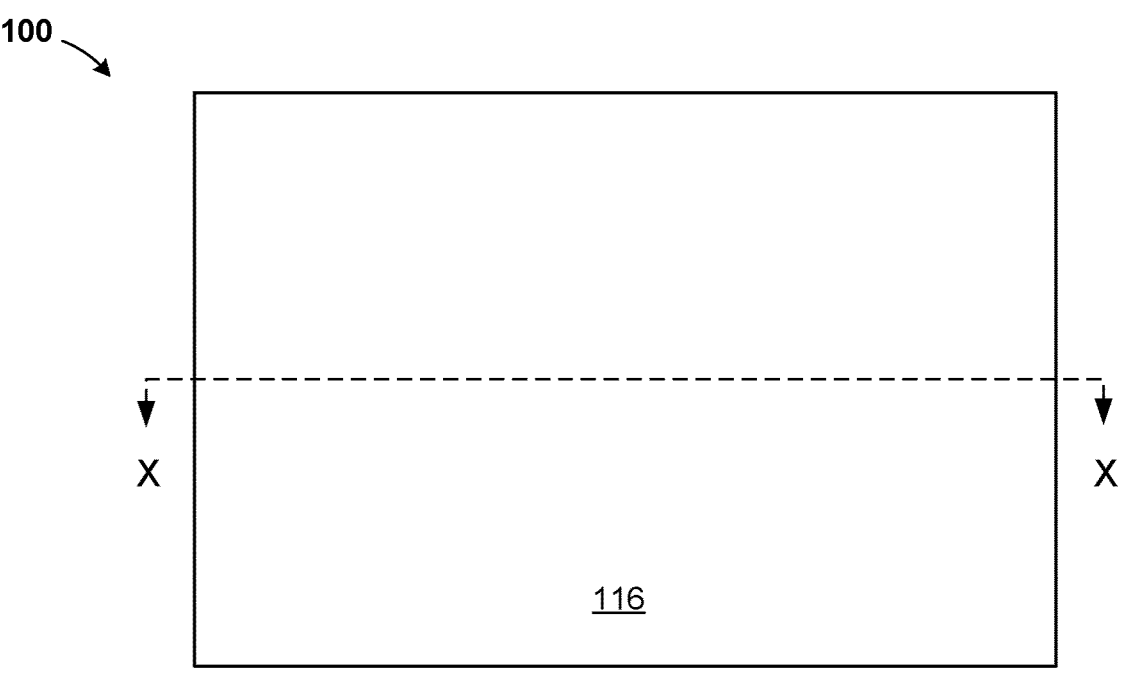
FIGS. 7 and 8 illustrate a top view and a cross-sectional view of the semiconductor structure, respectively, and illustrate forming a phase change material layer, according to an exemplary embodiment.
Figure 8:
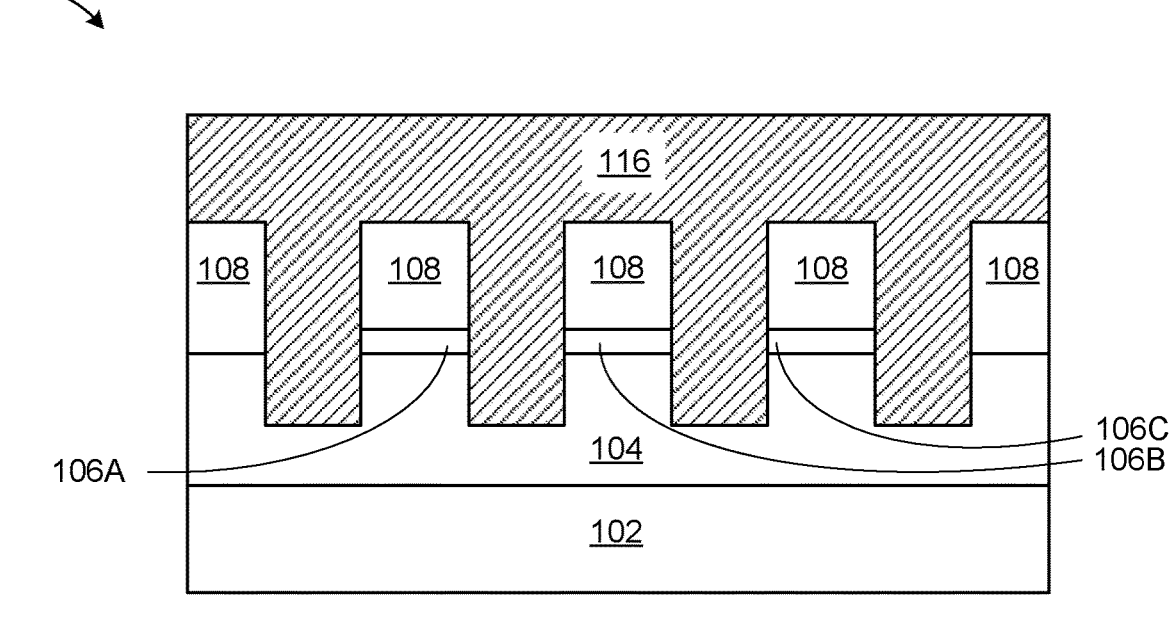

Referring now to FIGS. 7 and 8, the structure 100 is shown, according to an embodiment. FIG. 7 is a top view of the structure 100. FIG. 8 is a cross-sectional view of the structure 100 along section line X-X. A phase change material layer 116 may be formed.

The phase change material layer 116 may be blanket deposited on the structure 100, filling the openings 110, adjacent to vertical side surfaces and on upper surfaces of the dielectric layer 108. The phase change material layer 116 may be adjacent to an upper surface and vertical side surfaces of the dielectric layer 104. The phase change material layer 116 may be adjacent to adjacent to vertical side surfaces of the nanowires 106A, 106B and 106B.

Conventional deposition processes, such as electroplating, electroless plating, chemical vapor deposition, physical vapor deposition, atomic layer deposition or a combination of methods, can be used to deposit the phase change material layer 116. According to embodiments of the present invention, the phase change material layer 116 may be formed from a mixture of gallium (Ga) and antimony (Sb) and at least one of tellurium (Te), silicon (Si), germanium (Ge), arsenic (As), selenium (Se), indium (In), tin (Sn), bismuth (Bi), silver (Ag), gold (Au), and antimony (Sb). It is to be appreciated that the preceding list is merely illustrative and, thus, other elements can also be used to form the phase change material layer 116, while maintaining the spirit of the present principles disclosed herein. In an embodiment, the phase change material layer 116 may be made of a chalcogenide alloy such as germanium-antimony-tellurium (GST). According to another embodiment, the phase change material layer 116 may also be made of a transition metal oxide having multiple resistance states. For example, the phase change material layer 116 may be made of at least one material selected from the group consisting of NiO, TiO$_2$, HfO, Nb$_2$O$_5$, ZnO, WO$_3$, and CoO or GST (Ge$_2$Sb$_2$Te$_5$) or PCMO (PrxCa1-xMnO$_3$). In yet another embodiment, the phase change material layer 116 may be a chemical compound including one or more elements selected from the group consisting of sulfur (S), selenium (Se), tellurium (Te), arsenic (As), antimony (Sb), germanium (Ge), tin (Sn), indium (In), and silver (Ag). In an embodiment, the phase change material layer 116 may have a thickness ranging from about 10 nm to about 500 nm, although a thickness less than 10 nm and greater than 500 nm may be acceptable. The phase change material layer 116 may have a length along the section line X-X of 5 to 100 nanometers.

Figure 9:
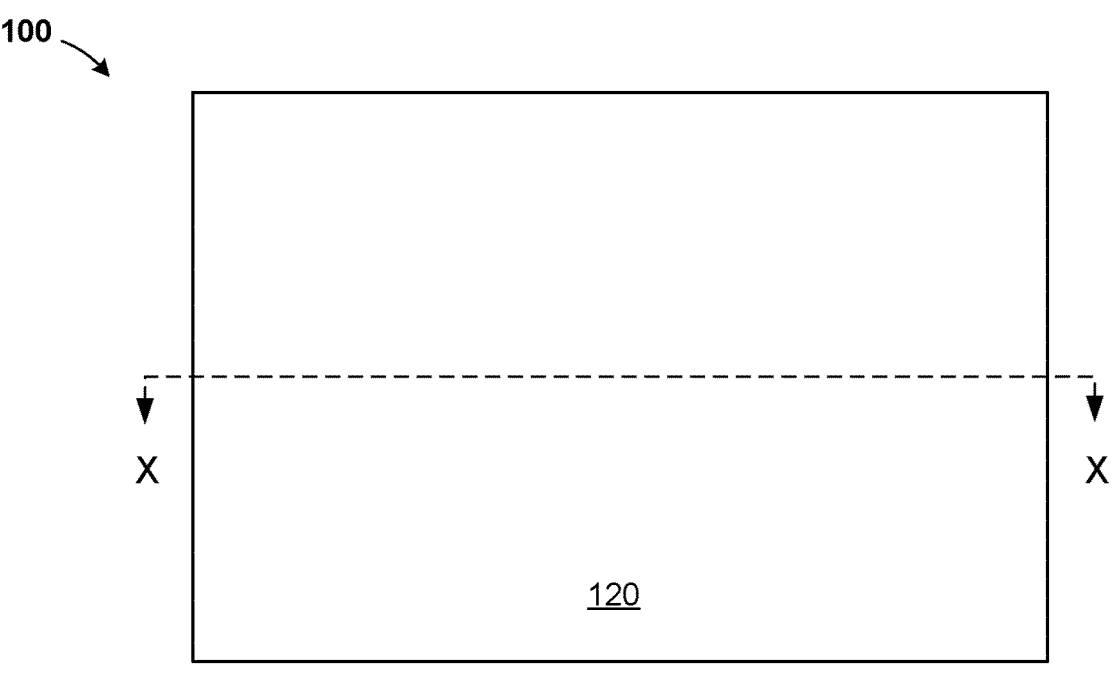
FIGS. 9 and 10 illustrate a top view and a cross-sectional view of the semiconductor structure, respectively, and illustrate forming a dielectric, according to an exemplary embodiment.
Figure 10:
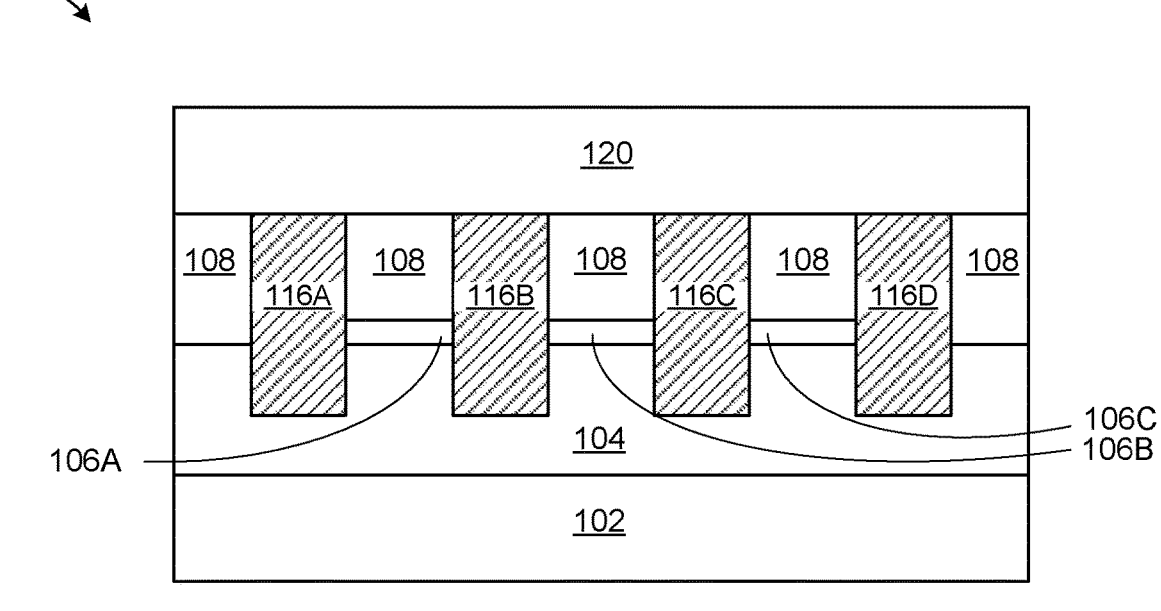

Referring now to FIGS. 9 and 10, the structure 100 is shown, according to an embodiment. FIG. 9 is a top view of the structure 100. FIG. 10 is a cross-sectional view of the structure 100 along section line X-X. A dielectric layer 120 may be formed.

A planarization process, such as, for example, chemical mechanical polishing (CMP) technique may be used to remove excess material and polish upper surfaces of the structure 100 such that upper horizontal surfaces of the phase change material layer 116 and the dielectric layer 108 are coplanar, providing a uniform horizontal surface. Portions of the phase change material layer 116 may be removed, resulting in remaining portions of the phase change material layer 116 identified as phase change materials 116A, 116B, 116C, and 116D.

The dielectric layer 120 may be formed on the structure 100, on the upper horizontal surfaces of the phase change materials 116A, 116B, 116C, and 116D, and the dielectric layer 108. The dielectric layer 120 may be formed as the dielectric layer 104 is formed.

Figure 11:
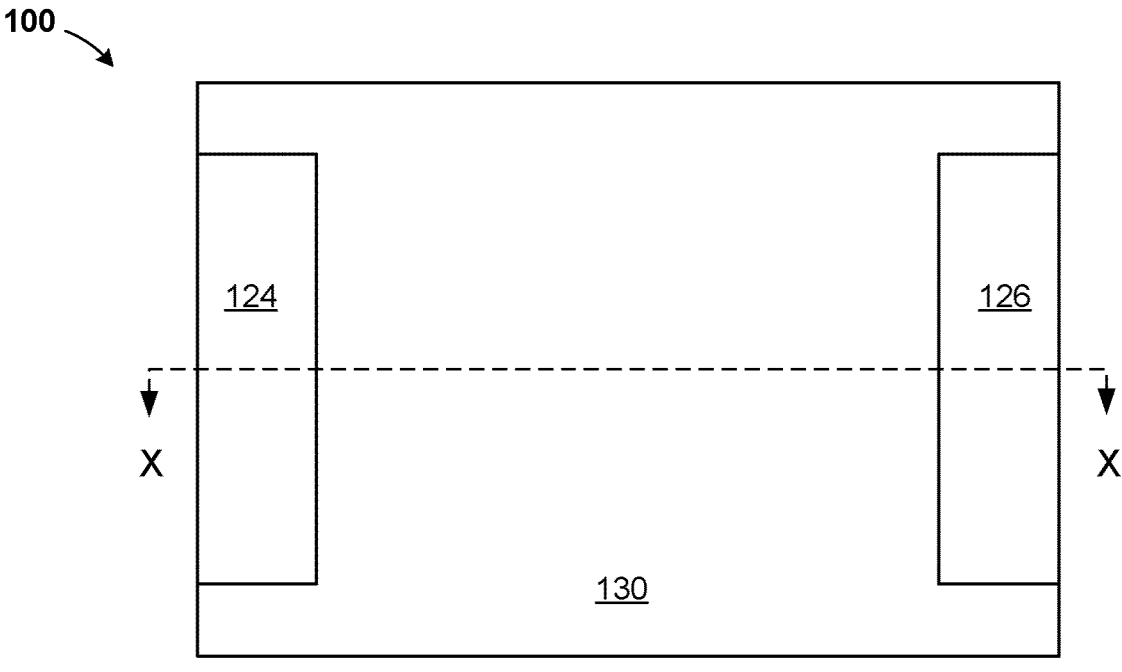
FIGS. 11 and 12 illustrate a top view and a cross-sectional view of the semiconductor structure, respectively, and illustrate forming a first electrode and a second electrode, according to an exemplary embodiment.
Figure 12:
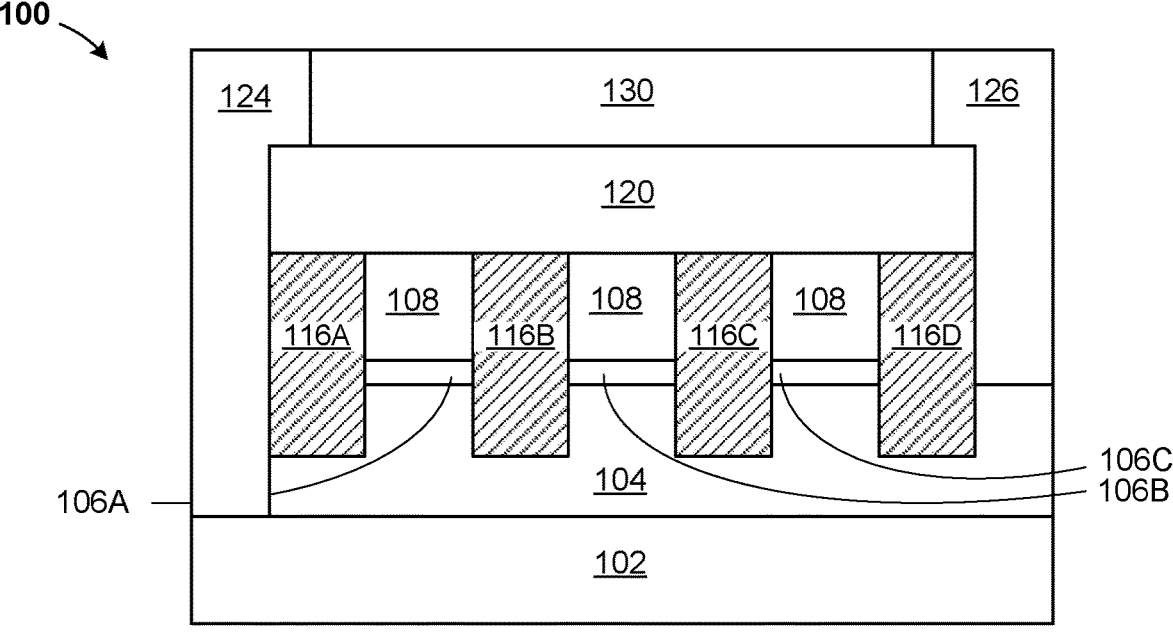

Referring now to FIGS. 11 and 12, the structure 100 is shown, according to an embodiment. FIG. 11 is a top view of the structure 100. FIG. 12 is a cross-sectional view of the structure 100 along section line X-X. A dielectric layer 130 may be formed. A first electrode 124 and a second electrode 126 may be formed.

The dielectric layer 130 may be formed conformably on the structure 100 as described for the dielectric layer 104, and may be formed on the dielectric layer 120.

Electrode openings (not shown) may be formed in the structure 100 and a conductive material layer formed in the electrode openings (not shown), to form the first electrode 124 and the second electrode 126. The electrode openings (not shown) may be formed by methods known in the arts.

A conductive material layer is deposited within the electrode openings (not shown) to form the first electrode 124 and the second electrode 126. The conductive material layer may include materials such as, for example, copper, tungsten, cobalt, or aluminum. The conductive material layer may be deposited using typical deposition techniques, for example, atomic layer deposition, molecular layer deposition, physical vapor deposition, and chemical vapor deposition.

A chemical mechanical polishing (CMP) technique may be used to remove excess material and polish upper surfaces of the structure 100, providing a uniform horizontal surface of the first electrode 124, the second electrode 126 and the dielectric layer 130.

The first electrode 124 may have a lower horizontal surface adjacent to an upper horizontal surface of the substrate 102. Alternatively, the first electrode 124 may have a lower horizontal surface adjacent to an upper horizontal surface of the dielectric layer 104. The first electrode 124 may have a vertical side surface adjacent to a vertical side surface of the phase change material layer 116A. The phase change material layer 116A is adjacent to the nanowire 106A, which is adjacent to the phase change material layer 116B. The phase change material layer 116B is adjacent to the nanowire 106B, which is adjacent to the phase change material layer 116C. The phase change material layer 116C is adjacent to the nanowire 106C, which is adjacent to the phase change material layer 116D. The phase change material layer 116D is adjacent to the second electrode 126.

In this embodiment, between the first electrode 124 and the second electrode 126, there are 4 separate phase change material layers 116A, 116B, 116C, 116D, each separated by a portion of the dielectric layer 108 surrounding a nanowire 106A, 106B, 106C which connects each pair of phase change material layers 116A, 116B, 116C, 116D. There may be any number of alternating layers of phase change material layers 116A, 116B, 116C, 116D between a first electrode 124 and a second electrode 126, each of the phase material layers 116A, 116B, 116C, 116D connected with a nanowire 106A, 106B, 106C surrounded by the dielectric layer 108.

The second electrode 126 may have a lower horizontal surface adjacent to an upper horizontal surface of the dielectric layer 104. The second electrode 126 may have a vertical side surface adjacent to a vertical side surface of the phase change material layer 116D.

In an alternate embodiment, the first electrode 124 and/or the second electrode 126 may be directly adjacent to the dielectric layer 108 with the heater element of the nanowire 106A, 106B, 106C. In this embodiment there may be directly adjacent to each other: the first electrode 124 next to a portion of the dielectric layer surrounding a nanowire 106A, directly next to phase change material layer 116A, directly next to a portion of the dielectric layer 208 surrounding the nanowire 106B, directly next to phase change material layer 116B, directly next to a portion of the dielectric layer 208 surrounding the nanowire 106C, directly next to phase change material layer 116C, directly next to a portion of the dielectric layer 208 surrounding the nanowire 106D, directly next to the second electrode 126. There may be any number of alternating layers of phase change material layers 116A, 116B, 116C, alternating with any number of dielectric layers 208 surrounding the nanowire 106A, 106B, 106C, 106D.

The structure 100 illustrates an individual cell, as depicted. There may be any number of individual cells on the structure 100. In an embodiment, additional layers may be formed surrounding the dielectric encapsulated heater elements layers of the nanowire 106A, 106B, 106C, and/or the phase change material layers 116A, 116B, 116C, 116D. The additional layers may include one or more layers and may include a thermal barrier layer, an adhesion layer, and a projection liner which reduces programming current and drift.

The structure 100 has reduced programming current due to heating of the each of the central phase change material layers 116B and 116C from two sides with aligned heaters and improved thermal confinement from each layer of phase change material layers 116A, 116B, 116C, 116D with each heater element of the nanowire 106A, 106B, 106C, and has lower power consumption during analog computing due to higher SET/RESET resistance of structure to change to and from an amorphized and crystalized state.

The dielectric layers 120, 108, 104 encapsulate the heater element of the nanowires 106A, 106C, 106B above, below and two vertical side surfaces of the heater element. Two remaining vertical side surfaces of the heater element may be adjacent to a phase change material layer 116A, 116B, 116C, 116D. Alternatively, one remaining vertical side surface of the heater element of the nanowires 106A, 106C, 106B may be adjacent to a phase change material layer 116A, 116B, 116C, 116D and one remaining vertical side surface of the heater element of the nanowires 106A, 106C, 106B may be adjacent to a first, second electrode 124, 126.

Figure 13:
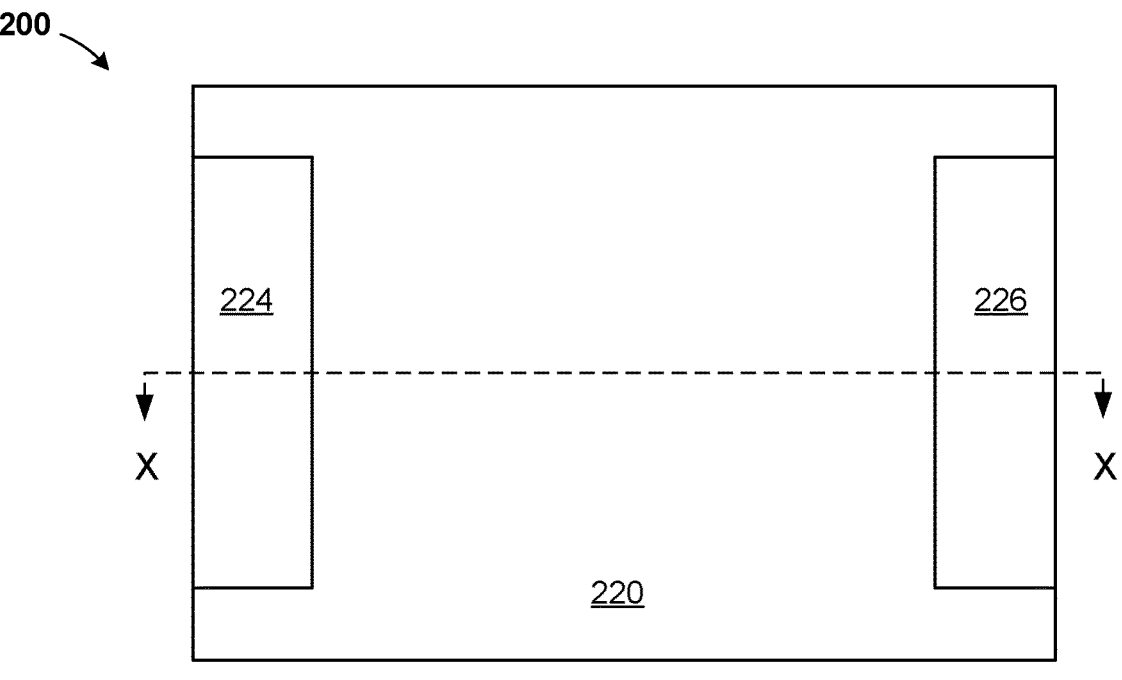
FIG. 13 illustrates a top view of a second semiconductor structure at an intermediate stage of fabrication, according to an exemplary embodiment.
Figure 14:
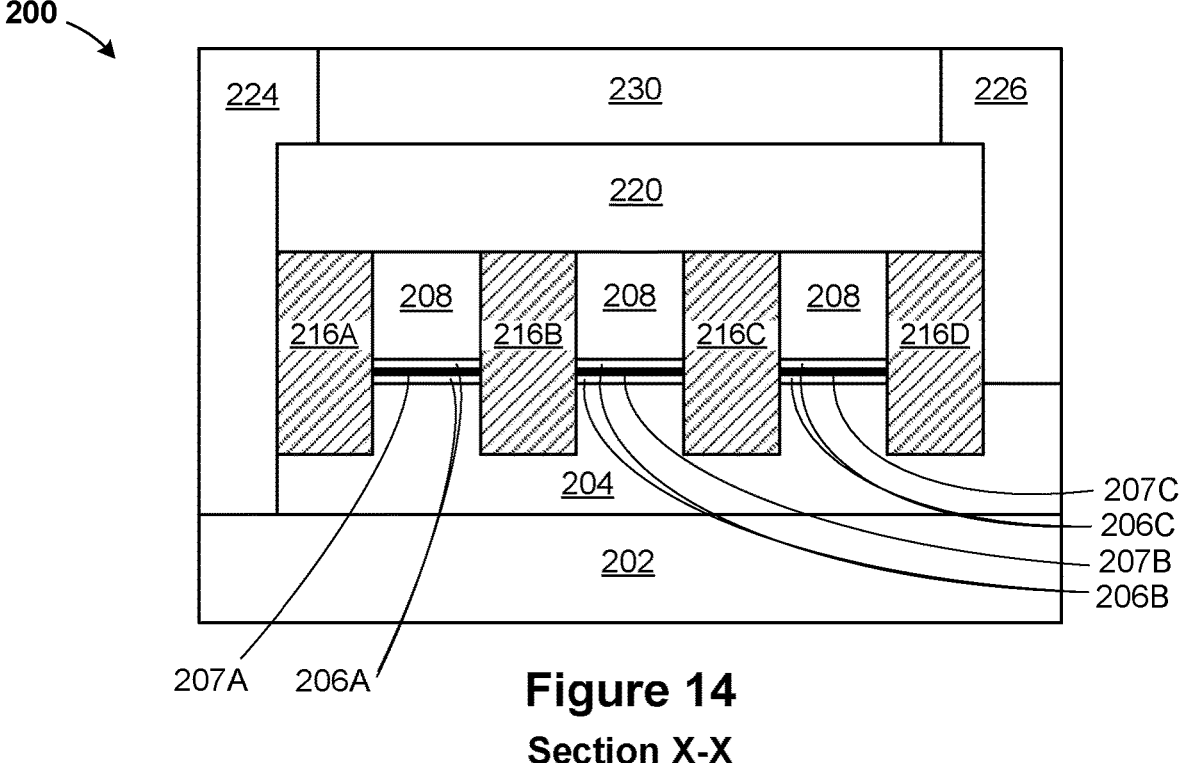
FIG. 14 illustrates a cross-sectional view of the second semiconductor structure of FIG. 13, according to an exemplary embodiment.

Referring now to FIGS. 13 and 14, a structure 200 is shown at an intermediate step of fabrication, according to an alternate embodiment. FIG. 13 is a top view of the structure 200. FIG. 14 is a cross-sectional view of the structure 200 along section line X-X.

The structure 200 is an alternative embodiment of the structure 100. A different material is used rather than the material of the nanowire 106. A high k dielectric line (not shown) may be formed rather than the nanowire 106. The high k dielectric line (not shown) may be separated into high k dielectric lines 206A, 206B, 206C, similar as the nanowire 106 is separated into the nanowires 106A, 106B, 106C by the openings 100 in the structure 100. The high k dielectric line (not shown) may be referred to as a high k dielectric nanowire.

The structure 200 includes, for example, a substrate 202, a dielectric layer 204, high k dielectric lines 206A, 206B, 206C, dielectric layer 208, phase change material layers 216A, 216B, 216C, 216C, dielectric layer 220, dielectric layer 230, a first electrode 224 and a second electrode 226.

Individual components of the structure 200 may be formed as described of similarly named components of the structure 100.

The high k dielectric lines 206A, 206B, 206C may be formed from a previously formed high k dielectric line (not shown), similar to the forming of the openings 110 of FIGS. 5 and 6. The high k dielectric line (not shown) may be formed in a line as shown for the nanowire 106 of FIG. 1. The high k dielectric line may include a material with a dielectric constant greater than or equal to 5.0. The high k dielectric line (not shown) may be formed of a high-k material, for example, MOX such as tantalum oxide ($Ta_2O_5$), and hafnium oxide ($HfO_2$). The high k dielectric line (not shown) may include one or more layers of one or more materials. The high k dielectric line (not shown) may be formed by E-beam lithography, extreme ultraviolet (EUV) or patterning the dielectric line (not shown) on the dielectric layer 104.

The high k dielectric line (not shown) which subsequently forms the high k dielectric lines 206A, 206B, 206C, may have a diameter between 3 and 100 nanometers and a length between 3 and 50 nanometers long along section line X-X for each of the high k dielectric lines 206A, 206B, and 206C.

The first electrode 224 may have a lower horizontal surface adjacent to an upper horizontal surface of the substrate 202. Alternatively, the first electrode 224 may have a lower horizontal surface adjacent to an upper horizontal surface of the dielectric layer 204. The first electrode 224 may have a vertical side surface adjacent to a vertical side surface of the phase change material layer 216A. The phase change material layer 216A is adjacent to the dielectric line 206A, which is adjacent to the phase change material layer 216B. The phase change material layer 216B is adjacent to the dielectric line 206B, which is adjacent to the phase change material layer 216C. The phase change material layer 216C is adjacent to the dielectric line 206C, which is adjacent to the phase change material layer 216D. The phase change material layer 216D is adjacent to the second electrode 226.

In this embodiment, between the first electrode 224 and the second electrode 226, there are 4 separate phase change material layers 216A, 216B, 216C, 216D, each separated by the dielectric layer 208, surrounding a high k dielectric line 206A, 206B, 206C which connects each pair of phase change material layers 216A, 216B, 216C, 216D. There may be any number of alternating layers of phase change material layers 216A, 216B, 216C, 216D between a first electrode 224 and a second electrode 226, each of the phase material layers 216A, 216B, 216C, 216D connected with a high k dielectric line 206A, 206B, 206C surrounded by the dielectric layer 208.

The second electrode 226 may have a lower horizontal surface adjacent to an upper horizontal surface of the dielectric layer 204. The second electrode 226 may have a vertical side surface adjacent to a vertical side surface of the phase change material layer 216D.

In an alternate embodiment, the first electrode 224 and/or the second electrode 226 may be directly adjacent to the dielectric layer 208 with the heater element of the high k dielectric line 206A, 206B, 206C. In this embodiment there may be directly adjacent to each other: the first electrode 224 next to a portion of the dielectric layer 208 surrounding the high k dielectric line 206A, directly next to phase change material layer 216A, directly next to a portion of the dielectric layer 208 surrounding the high k dielectric line 206B, directly next to phase change material layer 216B, directly next to a portion of the dielectric layer surrounding the high k dielectric line 206C, directly next to phase change material layer2, directly next to a portion of the dielectric layer surrounding the high k dielectric line 206D, directly next to the second electrode 216. There may be any number of alternating layers of phase change material layers 216A, 216B, 216C, alternating with any number of dielectric layers surrounding the high k dielectric line 206A, 206B, 206C, 206D.

The structure 200 illustrates an individual cell, as depicted. There may be any number of individual cells on the structure 200. In an embodiment, additional layers may be formed surrounding the dielectric encapsulated heater elements layers of the high k dielectric line 206A, 206B, 206C, and/or the phase change material layers 216A, 216B, 216C, 216D. The additional layers may include one or more layers and may include a thermal barrier layer, an adhesion layer, a projection liner which reduces programming current and drift.

A portion of each of the high k dielectric lines 206A, 206B, 206C may become a heater 207A, 207B, 207C, respectively, by a high voltage pulse or by applying a large enough electric field to induce dielectric breakdown in the high k dielectric line 206A, 206B, 206C to form a conductive bridge of the heater 207A, 207B, 207C. The heater 207A, 207B, 207C, of each of the high k dielectric line 206A, 206B, 206C is a conductive path between surrounding phase change material layers 216A, 216B, 216C, 216D.

The structure 200 has reduced programming current due to heating of each of the central phase change material layers 216B and 216C from two sides with aligned heaters 207A, 207B, 207C, and improved thermal confinement from each layer of phase change material layers 216A, 216B, 216C, 216D with each heater 207A, 207B, 207C, and has lower power consumption during analog computing due to higher SET/RESET resistance of structure to change to and from an amorphized and crystalized state.

The dielectric layers 220, 208, 204 encapsulate the heater 207A, 207B, 207C, above, below and two vertical side surfaces of the heater 207A, 207B, 207C. Two remaining vertical side surfaces of the heater 207A, 207B, 207C, may be adjacent to a phase change material layer 216A, 216B, 216C, 216D. Alternatively, one remaining vertical side surface of the heater 207A, 207B, 207C, may be adjacent to a phase change material layer 216A, 216B, 216C, 216D and one remaining vertical side surface of the heater 207A, 207B, 207C, may be adjacent to a first, second electrode 224, 226.

Figure 15:
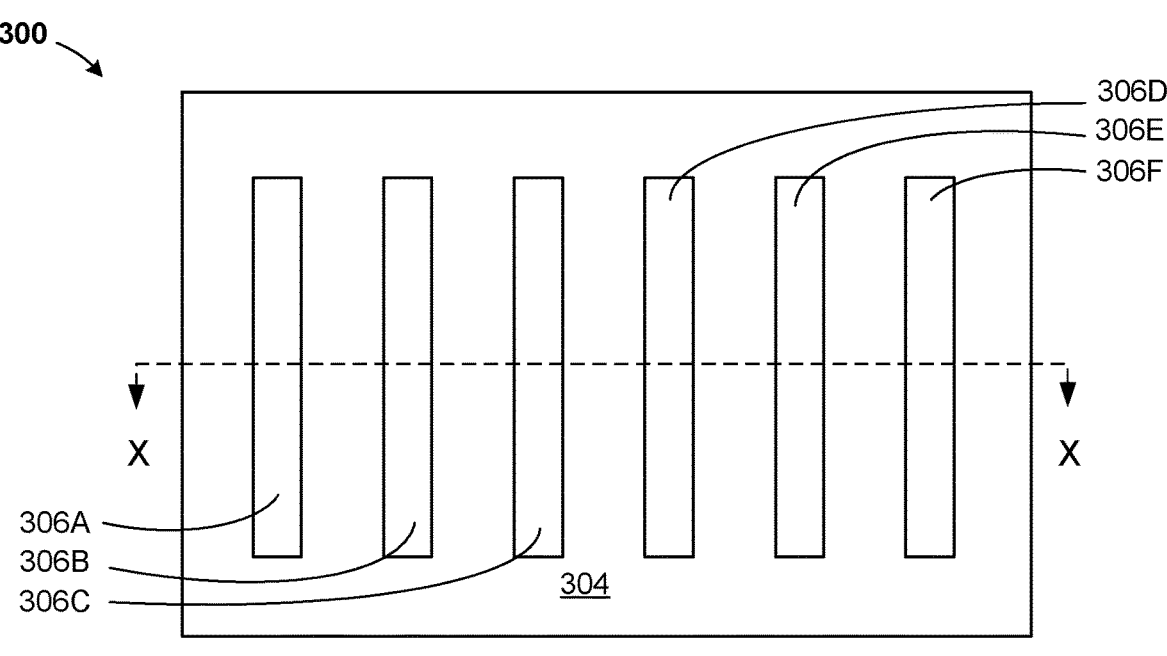
FIG. 15 illustrates a top view of a third second semiconductor structure at an intermediate stage of fabrication, according to an exemplary embodiment.
Figure 16:
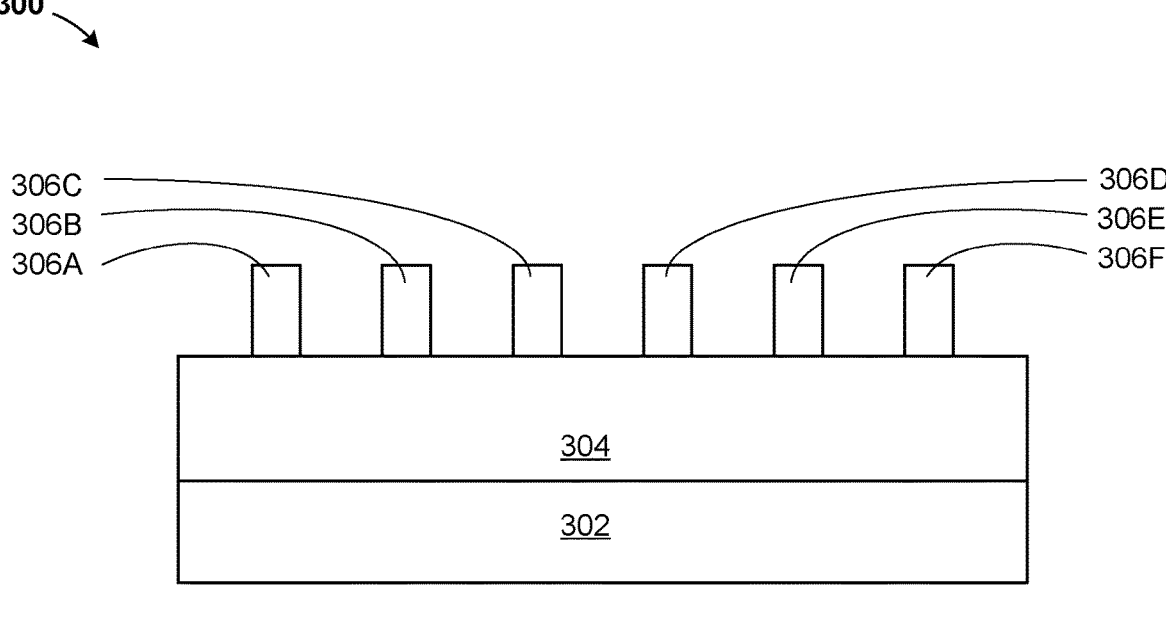
FIG. 16 illustrates a cross-sectional view of the third semiconductor structure of FIG. 15, according to an exemplary embodiment.

Referring now to FIGS. 15 and 16, a structure 300 is shown at an intermediate step of fabrication, according to an alternative embodiment. FIG. 15 is a top view of the structure 300. FIG. 16 is a cross-sectional view of the structure 300 along section line X-X.

The structure 300 includes, for example, a substrate 302, a dielectric layer 304, and high k dielectric lines 306A, 306B, 306C, 306D, 306E, 306F. Individual components of the structure 300 may be formed as described of similarly named components of the structures 100, 200. Similarly named items are formed as described above, including the substrate 302 and the dielectric layer 304.

The high k dielectric lines 306A, 306B, 306C, 306D, 306E, 306F may be formed of a high-k material. The high k dielectric lines may be formed by as described for the high k dielectric lines 206A, 206B, 206C.

The high k dielectric lines 306A, 306B, 306C, 306D, 306E, 306F, may have a width of 3 nm-50 nm, a height of 5 nm-500 nm and a length of 10 nm-1000 nm. A spacing between the high k dielectric lines 306A, 306B, 306C, 306D, 306E, 306F may be 5 nm-100 nm.

Figure 17:
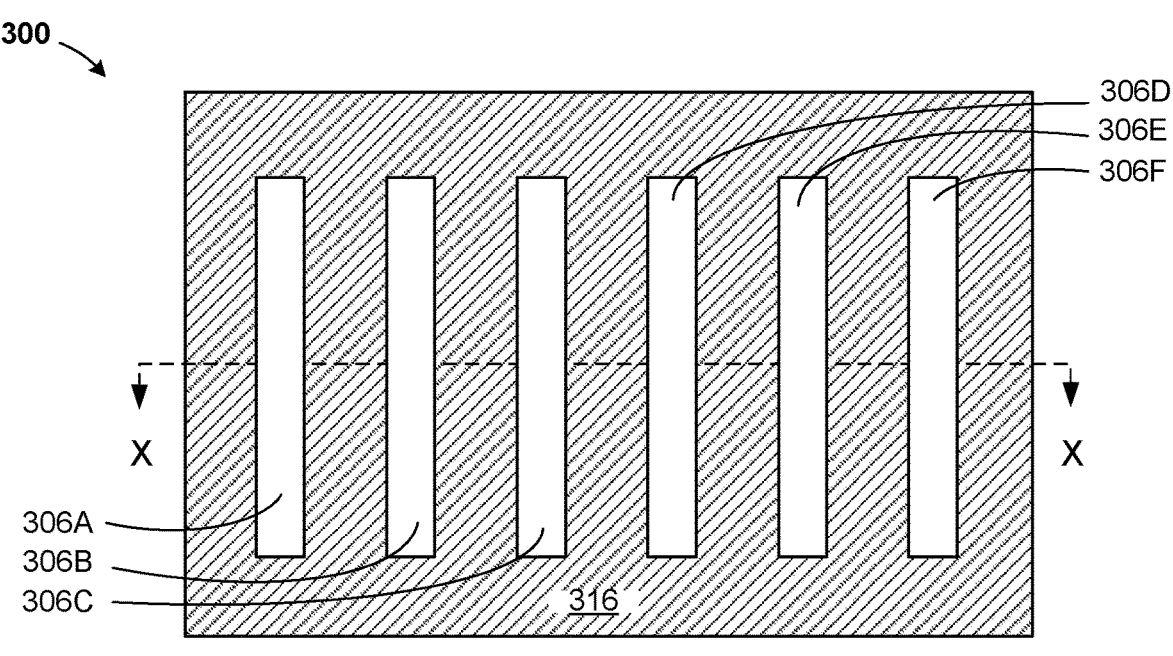
FIGS. 17 and 18 illustrate a top view and a cross-sectional view of the third semiconductor structure, respectively, and illustrate forming a phase change material layer, according to an exemplary embodiment.
Figure 18:
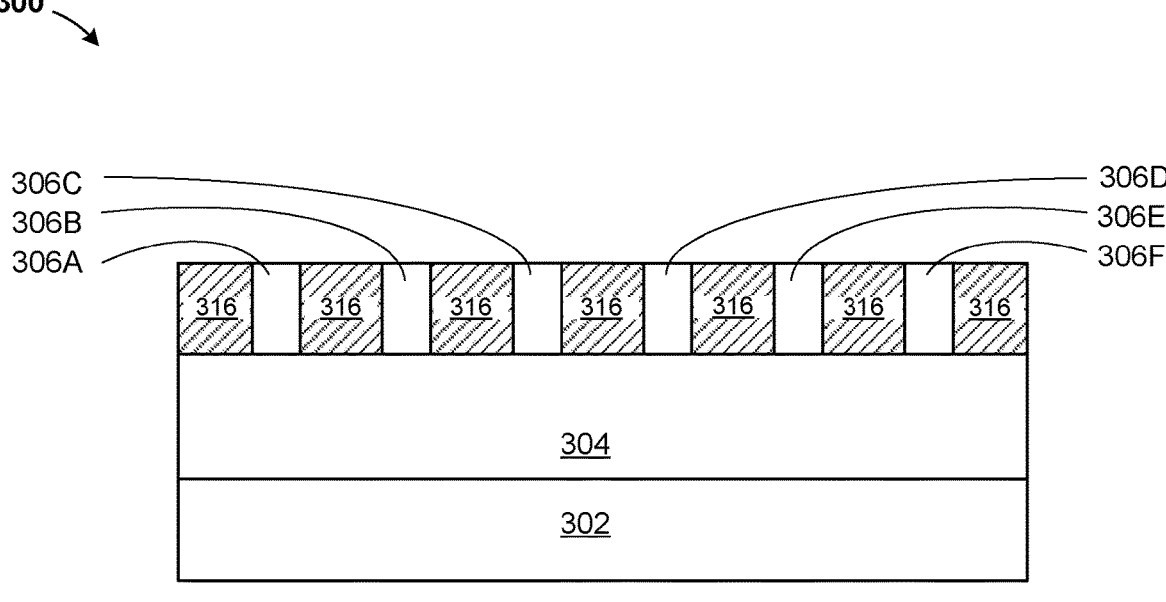

Referring now to FIGS. 17 and 18, the structure 300 is shown according to an alternative embodiment. FIG. 17 is a top view of the structure 300. FIG. 18 is a cross-sectional view of the structure 300 along section line X-X.

A phase change material layer 316 may be formed. The phase change material layer 316 may be formed conformably on the structure 300 as described for the phase change material layer 116, and may be formed on the dielectric layer 304 and the high k dielectric lines 306A, 306B, 306C, 306D, 306E, 306F.

A planarization process, such as, for example, chemical mechanical polishing (CMP), may be done to remove excess material from a top surface of the structure 300 such that upper horizontal surfaces of the phase change material layer 316 and the high k dielectric lines 306A, 306B, 306C, 306D, 306E, 306F are coplanar.

Figure 19:
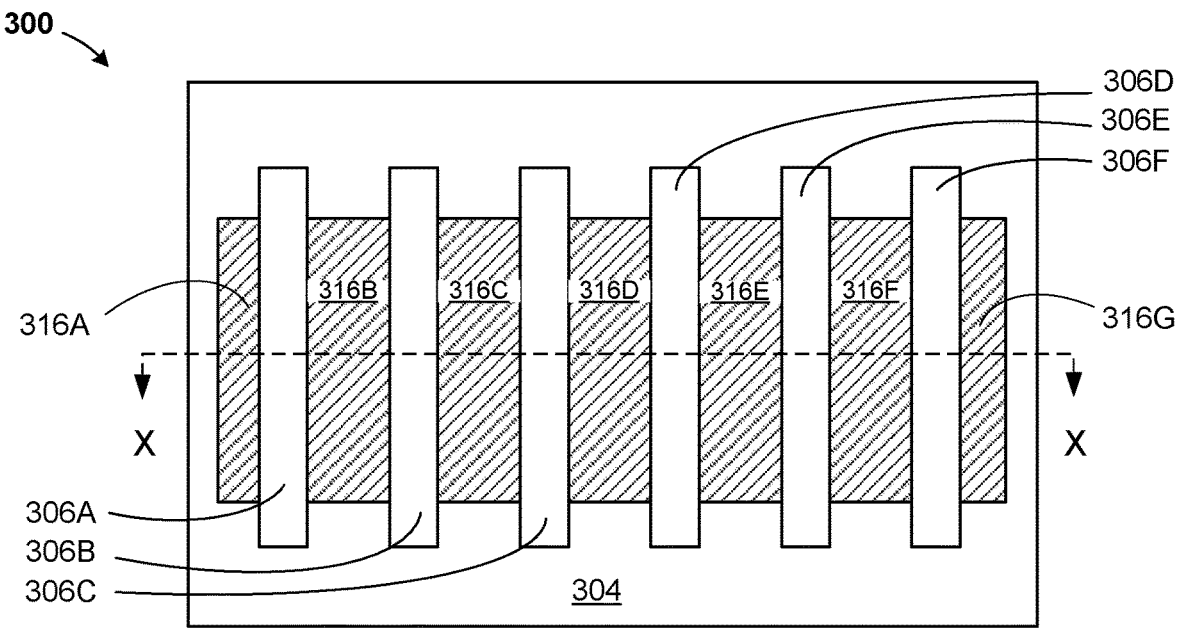
FIGS. 19 and 20 illustrate a top view and a cross-sectional view of the third semiconductor structure, respectively, and illustrate removing portions of the phase change material layer, according to an exemplary embodiment.
Figure 20:
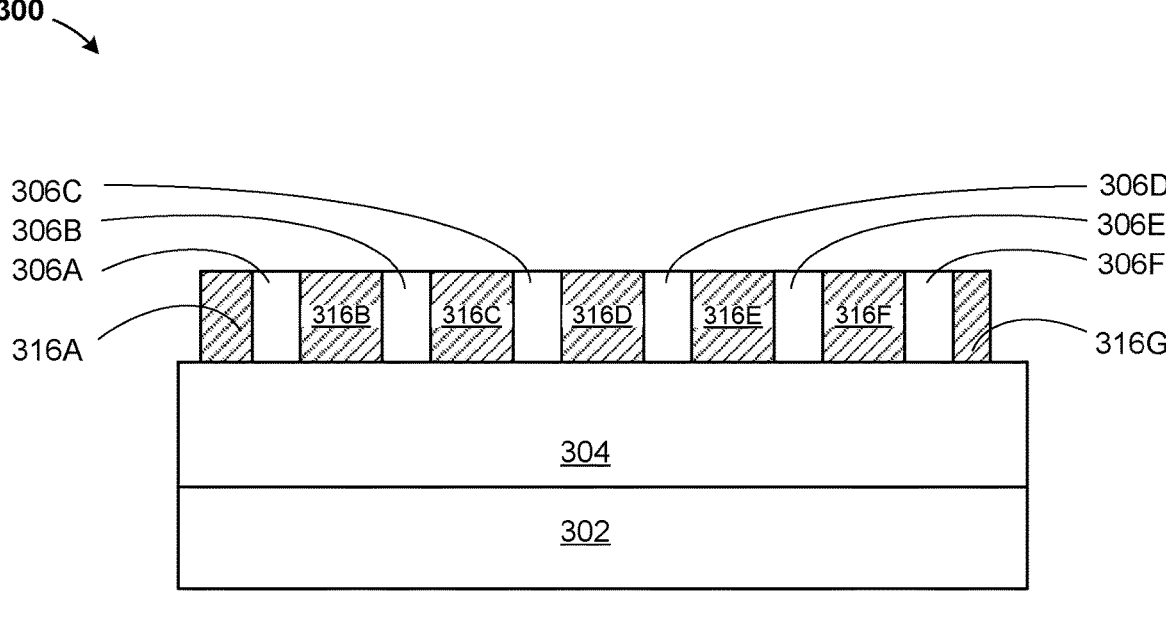

Referring now to FIGS. 19 and 20, the structure 300 is shown according to an alternative embodiment. FIG. 19 is a top view of the structure 300. FIG. 20 is a cross-sectional view of the structure 300 along section line X-X.

Portions of the phase change material layer 316 may be removed, by methods known in the arts. Remaining portions of the phase change material layer 316 may remain between the high k dielectric lines 306A, 306B, 306C, 306D, 306E, 306F, and are identified as phase change material layers 316A, 316B, 316C, 316D, 316E, 316F, 315G. The phase change material layer 316A may be adjacent to the high k dielectric line 306A. The phase change material layer 316B may be adjacent to and between the high k dielectric lines 306A, 306B. The phase change material layer 316C may be adjacent to and between the high k dielectric lines 306B, 306C. The phase change material layer 316D may be adjacent to and between the high k dielectric lines 306C, 306D. The phase change material layer 316E may be adjacent to and between the high k dielectric lines 306D, 306E. The phase change material layer 316F may be adjacent to and between the high k dielectric lines 306E, 306F. The phase change material layer 316G may be adjacent to the high k dielectric line 306G.

As shown in FIGS. 19 and 20, there are 6 high k dielectric lines 306A, 306B, 306C, 306D, 306E, 306F and 7 phase change material layers 316A, 316B, 316C, 316D, 316E, 316F, 315G. In an embodiment, there may be any number of high k dielectric lines 306A, 306B, 306C, 306D, 306E, 306F and any number of phase change material layers 316A, 316B, 316C, 316D, 316E, 316F, 315G.

Figure 21:
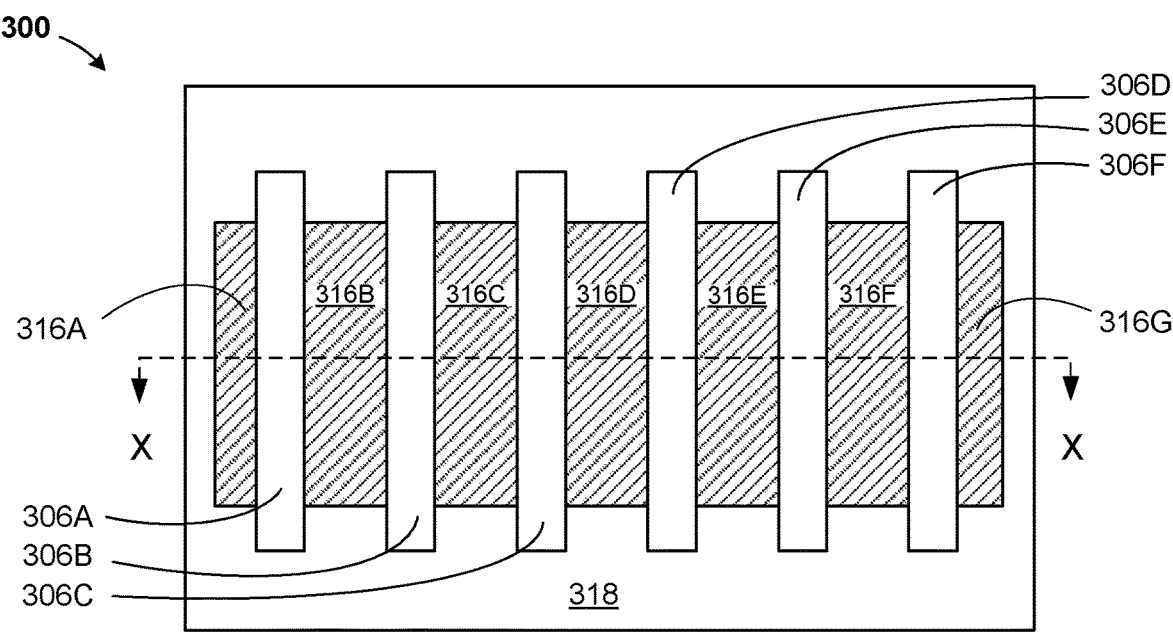
FIGS. 21 and 22 illustrate a top view and a cross-sectional view of the third semiconductor structure, respectively, and illustrate forming a dielectric, according to an exemplary embodiment.
Figure 22:
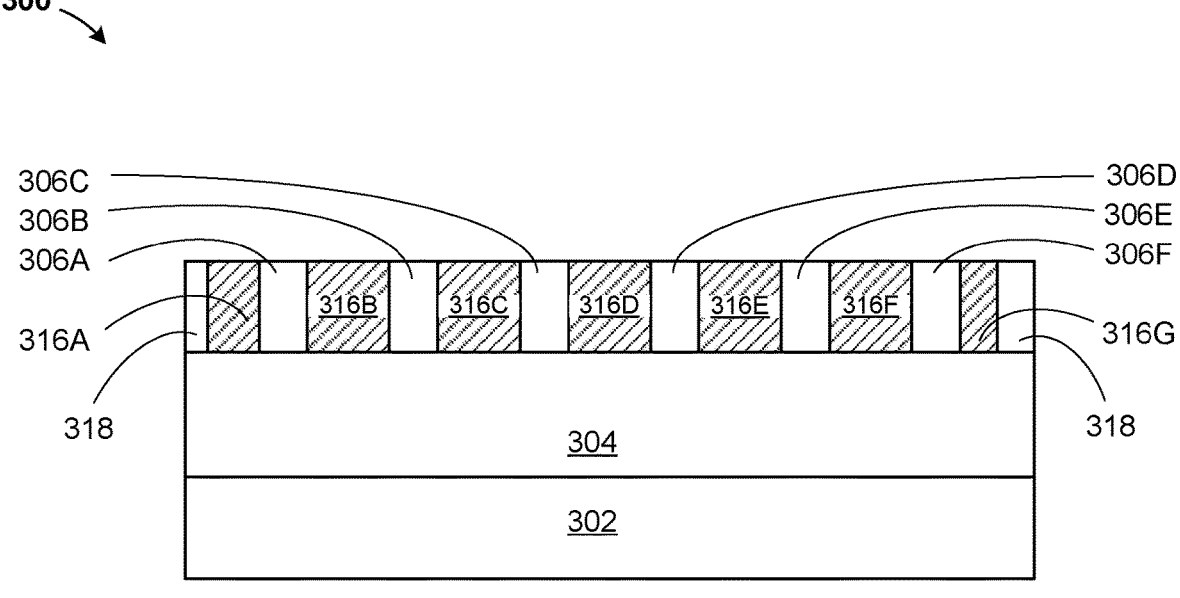

Referring now to FIGS. 21 and 22, the structure 300 is shown according to an alternative embodiment. FIG. 21 is a top view of the structure 300. FIG. 22 is a cross-sectional view of the structure 300 along section line X-X.

A dielectric layer 318 may be formed. The dielectric layer 318 may be formed conformably on the structure 300 as described for the dielectric layer 104, and may be formed on the dielectric layer 304, the high k dielectric lines 306A, 306B, 306C, 306D, 306E, 306F and the phase change material layers 316A, 316B, 316C, 316D, 316E, 316F, 315G.

A planarization process, such as, for example, chemical mechanical polishing (CMP), may be done to remove excess material from a top surface of the structure 300 such that upper horizontal surfaces of the dielectric layer 318, the high k dielectric lines 306A, 306B, 306C, 306D, 306E, 306F, and the phase change material layers 316A, 316B, 316C, 316D, 316E, 316F, 316G are coplanar.

Figure 23:
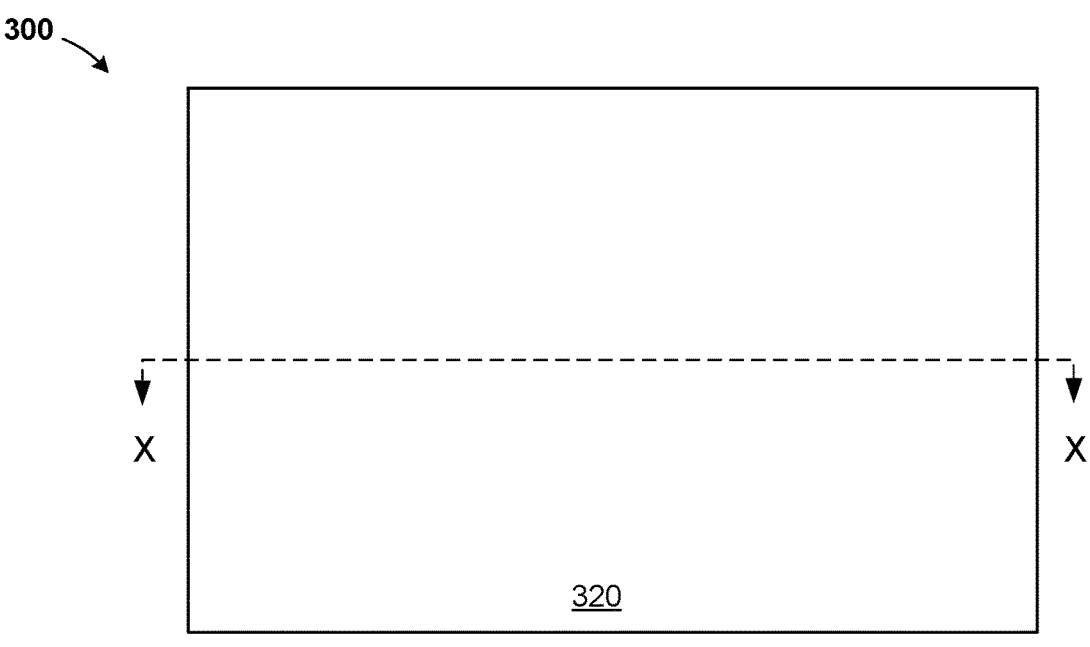
FIGS. 23 and 24 illustrate a top view and a cross-sectional view of the third semiconductor structure, respectively, and illustrate forming a dielectric, according to an exemplary embodiment.
Figure 24:
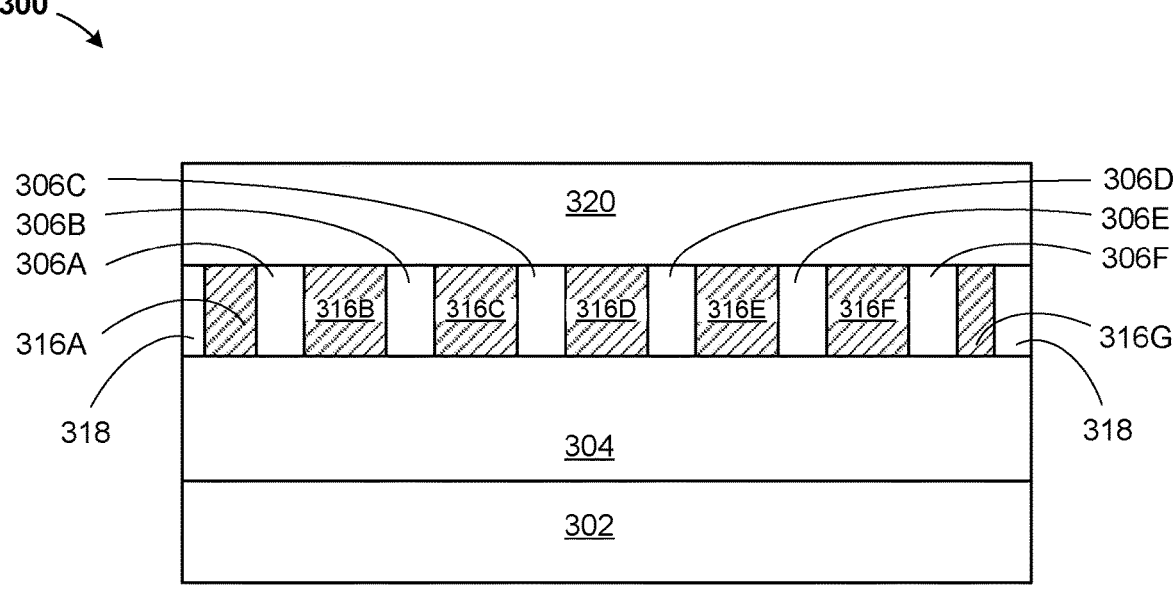

Referring now to FIGS. 23 and 24, the structure 300 is shown according to an alternative embodiment. FIG. 23 is a top view of the structure 300. FIG. 24 is a cross-sectional view of the structure 300 along section line X-X.

A dielectric layer 320 may be formed. The dielectric layer 320 may be formed conformably on the structure 300 as described for the dielectric layer 104, and may be formed on the high k dielectric lines 306A, 306B, 306C, 306D, 306E, 306F, the phase change material layers 316A, 316B, 316C, 316D, 316E, 316F, 316G and the dielectric layer 318.

A planarization process, such as, for example, chemical mechanical polishing (CMP), may be done to remove excess material from a top surface of the structure 300 such that an upper horizontal surface of the dielectric layer 320 is coplanar.

Figure 25:
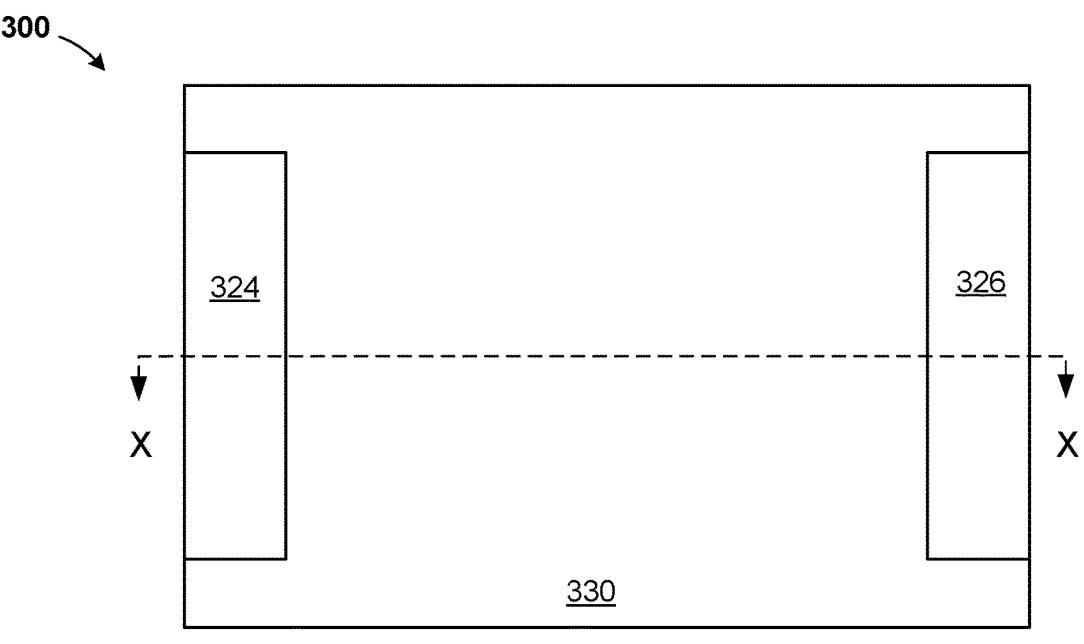
FIGS. 25 and 26 illustrate a top view and a cross-sectional view of the third semiconductor structure, respectively, and illustrate forming a first electrode and a second electrode, according to an exemplary embodiment.
Figure 26:
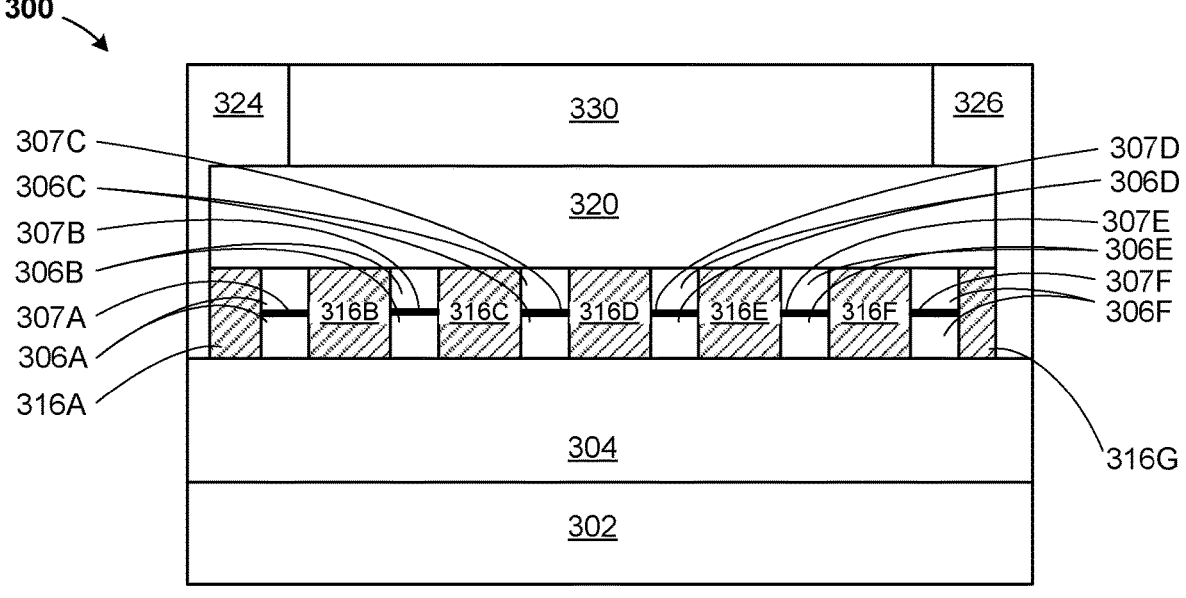

Referring now to FIGS. 25 and 26, the structure 300 is shown according to an alternative embodiment. FIG. 25 is a top view of the structure 300. FIG. 26 is a cross-sectional view of the structure 300 along section line X-X. A dielectric layer 330 may be formed. A first electrode 324 and a second electrode 326 may be formed.

The dielectric layer 330 may be formed conformably on the structure 300 as described for the dielectric layer 104, and may be formed on the dielectric layer 320.

Electrode openings (not shown) may be formed in the structure 300 and a conductive material layer formed in the electrode openings (not shown), to form the first electrode 324 and the second electrode 326. The electrode openings (not shown) may be formed by methods known in the arts. The first electrode 324 and the second electrode 326 may be formed as described for the first electrode 124 and the second electrode 126.

A chemical mechanical polishing (CMP) technique may be used to remove excess material and polish upper surfaces of the structure 300, providing a uniform horizontal surface of the first electrode 324, the second electrode 326 and the dielectric layer 330.

The first electrode 324 may have a lower horizontal surface adjacent to an upper horizontal surface of the substrate 302. Alternatively, the first electrode 324 may have a lower horizontal surface adjacent to an upper horizontal surface of the dielectric layer 304. The first electrode 324 may have a vertical side surface adjacent to a vertical side surface of the phase change material layer 316A. The phase change material layer 316A is adjacent to the high k dielectric line 306A, which is adjacent to the phase change material layer 316B. The phase change material layer 316B is adjacent to the high k dielectric line 306B, which is adjacent to the phase change material layer 316C. The phase change material layer 316C is adjacent to the dielectric layer 306C, which is adjacent to the phase change material layer

316D. The phase change material layer 316D is adjacent to the high k dielectric line 306D, which is adjacent to the phase change material layer 316E. The phase change material layer 316E is adjacent to the dielectric layer 306E, which is adjacent to the phase change material layer 316F. The phase change material layer 316F is adjacent to the high k dielectric line 306F, which is adjacent to the phase change material layer 316G. The phase change material layer 316G is adjacent to the second electrode 326.

In this embodiment, between the first electrode 324 and the second electrode 326, there are 7 separate phase change material layers 316A, 316B, 316C, 316D, 316E, 316F, 316G each separated by a high k dielectric line 306A, 306B, 306C, 306D, 306E, 306F which connects each pair of phase change material layers 316A, 316B, 316C, 316D, 316E, 316F, 316G. There may be any number of alternating layers of phase change material layers 316A, 316B, 316C, 316D, 316E, 316F, 316G between a first electrode 324 and a second electrode 326, each of the phase material layers 316A, 316B, 316C, 316D, 316E, 316F, 316G connected with a high k dielectric line 306A, 306B, 306C, 306D, 306E, 306F.

The second electrode 326 may have a lower horizontal surface adjacent to an upper horizontal surface of the dielectric layer 304. The second electrode 326 may have a vertical side surface adjacent to a vertical side surface of the phase change material layer 316G.

In an alternate embodiment, the first electrode 324 and/or the second electrode 326 may be directly adjacent to the high k dielectric lines 306A, 306E. In this embodiment there may be directly adjacent to each other: the first electrode 324 next to the high k dielectric line 306A, directly next to phase change material layer 316A, directly next to the high k dielectric line 306B, directly next to phase change material layer 316B, directly next to the high k dielectric line 306C, directly next to phase change material layer 316C, directly next to the high k dielectric line 306D, directly next to the second electrode 326. There may be any number of alternating layers of phase change material layers 316A, 316B, 316C, alternating with any number of high k dielectric line 306A, 306B, 306C, 206D.

The structure 300 illustrates an individual cell, as depicted. There may be any number of individual cells on the structure 300. In an embodiment, additional layers may be formed surrounding the dielectric encapsulated heater elements layers of the high k dielectric lines 306A, 306B, 306C, 306D, 306E, 306F, and/or the phase change material layers 316A, 316B, 316C, 316D, 316E, 316F, 316G. The additional layers may include one or more layers and may include a thermal barrier layer, an adhesion layer, a projection liner which reduces programming current and drift.

A portion of each of the high k dielectric lines 306A, 306B, 306C, 306D, 306E, 306F may become a heater 307A, 307B, 307C, 307D, 307E, 307F, respectively, by a high voltage pulse or by applying a large enough electric field to induce dielectric breakdown in the high k dielectric line 306A, 306B, 306C, 306D, 306E, 306F to form a conductive bridge. The heater 307A, 307B, 307C, 307D, 307E, 307F, of each of the high k dielectric line 306A, 306B, 306C, 306D, 306E, 306F is a conductive path between surrounding phase change material layers 316A, 316B, 316C, 316D, 316E, 316F, 316G.

The structure 300 has reduced programming current due to a reduced heater 307A, 307B, 307C, 307D, 307E, 307F, diameter formed by dielectric breakdown of the high k dielectric line 306A, 306B, 306C, 306D, 306E, 306F and improved thermal confinement from each layer of phase change material layers 316A, 316B, 316C, 316D, 316E,

316F, 316G with each heater 307A, 307B, 307C, 307D, 307E, 307F, and has lower power consumption during analog computing due to higher SET/RESET resistance of structure to change to and from an amorphized and crystallized state.

The dielectric layers 320, 304 encapsulate the heater 307A, 307B, 307C, 307D, 307E, 307F, above, below and two vertical side surfaces of the heater 307A, 307B, 307C, 307D, 307E, 307F. Two remaining vertical side surfaces of the heater 307A, 307B, 307C, 307D, 307E, 307F may be adjacent to a phase change material layer 316A, 316B, 316C, 236D, 316E, 316F, 316G. Alternatively, one remaining vertical side surface of the heater 307A, 307B, 307C, 307D, 307E, 307F, may be adjacent to a phase change material layer 316A, 316B, 316C, 316D, 316E, 316F, 316G and one remaining vertical side surface of the heater 307A, 307B, 307C, 307D, 307E, 307F may be adjacent to a first, second electrode 324, 326.

Figure 27:
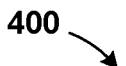
FIG. 27 illustrates a side view of a fourth semiconductor structure at an intermediate stage of fabrication, according to an exemplary embodiment.
Figure 27:
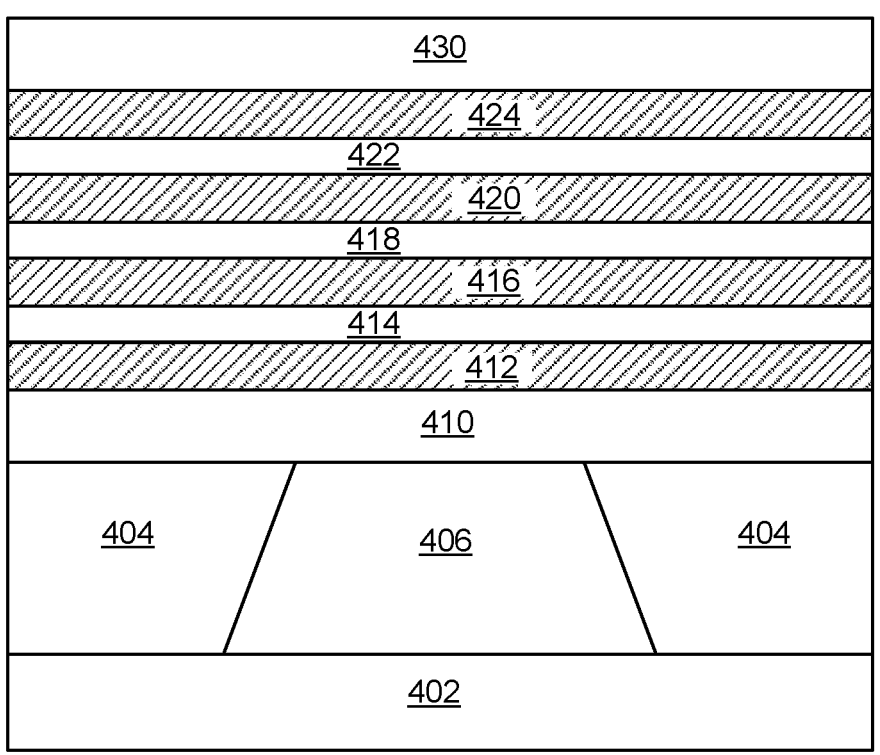

Referring now to FIG. 27, a structure 400 is shown at an intermediate step of fabrication, according to an alternative embodiment. FIG. 27 is a cross-sectional view of the structure 400.

The structure 400 includes, for example, a substrate 402, a dielectric layer 404 over the substrate 402, a bottom electrode 410 formed in the dielectric layer 404 and directly contacting the substrate 402, a phase change material layer 412 on the bottom electrode, a high k dielectric layer 414 on the phase change material layer 412, a phase change material layer 416 on the high k dielectric layer 414, a high k dielectric layer 418 on the phase change material layer 416, a phase change material layer 420 on the high k dielectric layer 418, a high k dielectric layer 422 on the phase change material layer 420, a phase change material layer 424 on the high k dielectric layer 422, and a second electrode 430 on the phase change material layer 424.

The structure 400 is a vertical structure, as compared to the structures 100, 200, 300, which are horizontal structures. Individual components of the structure 400 may be formed as described of similarly named components of the structures 100, 200, 300. Similarly named items are formed as described above, including the substrate 402 and the dielectric layer 404, the first electrode 410, the second electrode 430, the phase change material layers 412, 416, 420, 424, and the high k dielectric layers 414, 418, 422. The phase change material layers 412, 416, 420, 424 may have a thickness between 5 nm and 100 nm.

The high k dielectric layers 414, 418, 422 may be formed of a high-k material. The high k dielectric layers may be formed by as described for the high k dielectric lines 206A, 206B, 206C. The high k dielectric layers 414, 418, 422 may be formed of a high-k material, for example, MOX such as $Ta_2O_5$, $HfO_2$. In an embodiment the high k dielectric layers 414, 418, 422, may include mixed ionic electronic conducting (MIEC) filament layers, for example silicon (Si) or silver (Ag) with ion barriers. Ion barriers are an energy barrier for an ion to move in physical space. The ion stays in place until sufficient energy (e.g. electric field) overcomes the barrier. The high k dielectric layers 414, 418, 422 may have a thickness between 3 nm and 50 nm.

There may be any number of alternating high k dielectric layers 414, 418, 422 alternating with any number of phase change material layers 412, 416, 420. In this embodiment, there are 3 high k dielectric layers 414, 418, 422 alternating with 4 phase change material layers 412, 416, 420, 424. The first electrode 410, the second electrode 430 are directly adjacent to the phase change material layers 412, 424, respectively. In an alternate embodiment, there may be high k dielectric layers directly adjacent to the first electrode 410 and the second electrode 430.

Figure 28:
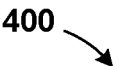
FIG. 28 illustrates a side view of the fourth semiconductor structure and illustrates forming an individual cell and forming a metal contact, according to an exemplary embodiment.
Figure 28:
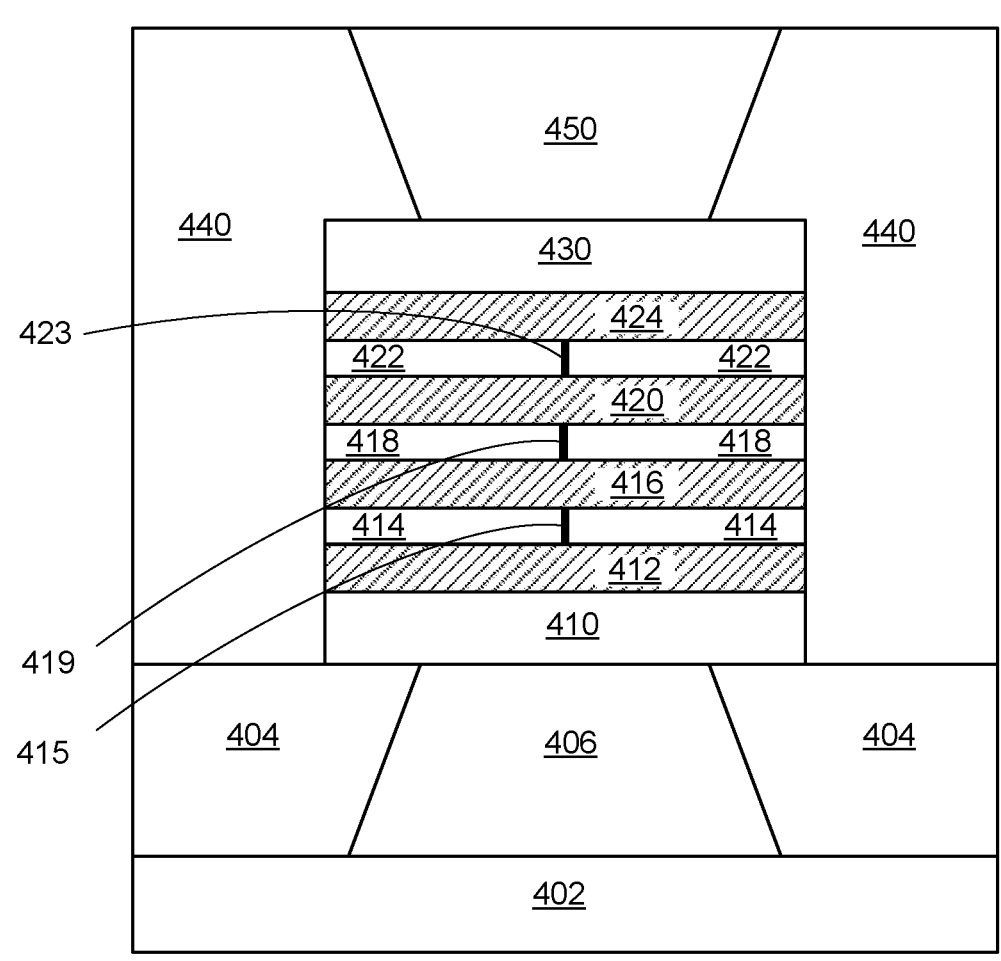

Referring now to FIG. 28, the structure 400 is shown according to an embodiment. The structure 400 may be formed into an individual cell. In an embodiment, there may be any number of individual cells in the structure 400. A dielectric layer 440 may be formed. A metal contact 450 may be formed.

The individual cell can be formed using patterning techniques known in the art. More specifically, vertically aligned portions of the first electrode 410, the second electrode 430, the high k dielectric layers 414, 418, 422 and the phase change material layers 412, 416, 420, 424 may be selectively removed using an anisotropic etching technique, such as, for example, reactive ion etching. The cell may include vertically aligned portions of the first electrode 410, the second electrode 430, the high k dielectric layers 414, 418, 422 and the phase change material layers 412, 416, 420 vertically aligned above the metal contact 406. The metal contact 406 may be a metal line or may be a via. Preferably, an upper surface of the dielectric layer 404 is exposed as a result of patterning the aforementioned layers. In general, a footprint of the individual cells will mimic existing phase change memory pillar cells and be similarly limited based on the function of a phase change memory pillar cell. For example, a typical phase change memory pillar cell may have a lateral width or diameter ranging from about 10 nm to about 500 nm.

In an alternate embodiment, the first electrode 224 and/or the second electrode 226 may be directly adjacent to the dielectric layer 208 with the heater element of the high k dielectric line 206A, 206B, 206C. In this embodiment there may be directly adjacent to each other: the first electrode 224 next to a portion of the dielectric layer 208 surrounding the high k dielectric line 206A, directly next to phase change material layer 216A, directly next to a portion of the dielectric layer 208 surrounding the high k dielectric line 206B, directly next to phase change material layer 216B, directly next to a portion of the dielectric layer surrounding the high k dielectric line 206C, directly next to phase change material layer2, directly next to a portion of the dielectric layer surrounding the high k dielectric line 206D, directly next to the second electrode 216. There may be any number of alternating layers of phase change material layers 216A, 216B, 216C, alternating with any number of dielectric layers surrounding the high k dielectric line 206A, 206B, 206C, 206D.

The dielectric layer 440 may be formed as describe for the dielectric layer 104. The dielectric layer 440 may be conformally formed on the structure 400 and may provide vertical isolation between individual cells.

A planarization process, such as, for example, chemical mechanical polishing (CMP), may be done to remove excess material from a top surface of the structure 400 such that upper horizontal surfaces of the dielectric layer 440 are coplanar.

An opening, not shown, may be made in the dielectric layer 440, and the metal contact 450 formed in the opening (not shown). The metal contact 450 may be formed as described for the metal contact 406. The metal contact 450 may be vertically aligned above the remaining vertically aligned portions of the first electrode 410, the second electrode 430, the high k dielectric layers 414, 418, 422 and the phase change material layers 412, 416, 420.

A planarization process, such as, for example, chemical mechanical polishing (CMP), may be done to remove excess material from a top surface of the structure 400 such that upper horizontal surfaces of the dielectric layer 440 and the metal contact 450 are coplanar.

In an embodiment, additional layers may be formed surrounding the dielectric encapsulated heater elements layers of the high k dielectric layers 410, 414, 418, 422, and/or the phase change material layers 412, 416, 420, 424. The additional layers may include one or more layers and may include a thermal barrier layer, an adhesion layer, a projection liner which reduces programming current and drift.

A portion of each of the high k dielectric layers 414, 418, 422 may become a heater 415, 419, 423, respectively, by a high voltage pulse or by applying a large enough electric field to induce dielectric breakdown in the high k dielectric layers 414, 418, 422 to form a conductive bridge. The heater 415, 419, 423 of each of the high k dielectric layers 414, 418, 422 is a conductive path between surrounding phase change material layers 412, 416, 420, 424.

The structure 400 has reduced programming current due to a reduced heater 415, 419, 423, diameter formed by dielectric breakdown of the high k dielectric layers 414, 418, 422, and improved thermal confinement from each layer of phase change material layers 412, 416, 420, 424 with each heater 415, 419, 423 of the high k dielectric layers 414, 418, 422, and has lower power consumption during analog computing due to higher SET/RESET resistance of structure to change to and from an amorphized and crystalized state.

The dielectric layer 440 encapsulates the heater 415, 419, 423, on all vertical side surfaces of the heater 415, 419, 423. An upper surface and a lower surface of the of the heater 415, 419, 423 may be adjacent to a phase change material layer 412, 416, 420, 424. Alternatively, either the upper or lower surface of the heater 415, 419, 423, may be adjacent to a phase change material layer 412, 416, 420, 424, and one remaining either upper or lower surface of the heater 415, 419, 423 may be adjacent to a first, second electrode 410, 430.

An advantage of the vertical structure of the structure 400 comparted to the horizontal structure of the structure 100, 200, 300 is a comparatively simple fabrication flow.

An advantage of the horizontal structure of the structure 100, 200 compared to the vertical structure of the structure 400 is a better control of heater alignment to minimize the programming current and power consumption.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
alternating layers of phase change material layers and dielectric encapsulated heater element layers, the alternating layers of phase change material layers and the dielectric encapsulated heater element layers are sandwiched between a first electrode and a second electrode, and a high voltage pulse to the dielectric encapsulated heater element layer forms filamentary heaters, wherein the dielectric layer comprises a dielectric constant greater than or equal to 5.0.

18

2. The structure according to claim 1, wherein the alternating layers of phase change material layers and dielectric encapsulated heater element layers are vertically aligned.

3. The structure according to claim 2, wherein
the dielectric encapsulated heater element layers each comprise a heater, wherein dielectric surrounds the heater on all vertical side surfaces of the heater.

4. The structure according to claim 1, wherein the alternating layers of phase change material layers and dielectric encapsulated heater element layers are horizontally aligned.

5. The structure according to claim 4, wherein
the dielectric encapsulated heater element layers each comprise a heater, wherein dielectric surrounds the heater on a horizontal upper surface, on a horizontal lower surface and on two vertical side surfaces of the heater.

6. The structure according to claim 1, wherein
a heater element of each of the dielectric encapsulated heater element layers comprise a conducting nanowire connecting adjacent phase change material layers.

7. The structure according to claim 1, wherein
a heater element of each the dielectric encapsulated heater element layers comprises a high k dielectric filament heater connecting adjacent phase change material layers.

8. The structure according to claim 1, wherein
the first electrode is directly adjacent to a first phase change material layer of the alternating layers of phase change material layers.

9. The structure according to claim 1, wherein
the first electrode is directly adjacent to a first dielectric encapsulated heater element layer of the alternating layer of dielectric encapsulated heater element layers.

10. A structure comprising:
horizontally aligned alternating layers of phase change material layers and dielectric encapsulated heater element layers, the alternating layers of phase change material layers and the dielectric encapsulated heater element layers are sandwiched between a first electrode and a second electrode, and a high voltage pulse to the dielectric encapsulated heater element layer forms filamentary heaters, wherein the dielectric layer comprises a dielectric constant greater than or equal to 5.0.

11. The structure according to claim 10, wherein
the heater element of each of the dielectric encapsulated heater element layers comprise a conducting nanowire connecting adjacent phase change material layers.

12. The structure according to claim 10, wherein
the heater element of each the dielectric encapsulated heater element layers comprises a high k dielectric filament heater connecting adjacent phase change material layers.

13. The structure according to claim 10, wherein
the dielectric encapsulated heater element layers each comprise a heater, wherein dielectric surrounds the heater on all vertical side surfaces of the heater.

14. The structure according to claim 10, wherein
the dielectric encapsulated heater element layers each comprise a heater, wherein dielectric surrounds the heater on a horizontal upper surface, on a horizontal lower surface and on two vertical side surfaces of the heater.

15. The structure according to claim 10, wherein
the first electrode is directly adjacent to a first phase change material layer of the alternating layers of phase change material layers.

16. The structure according to claim 10, wherein
the first electrode is directly adjacent to a first dielectric
encapsulated heater element layer of the alternating
layer of dielectric encapsulated heater element layers.

17. A method of forming a structure, the method comprising:

forming alternating layers of phase change material layers
and dielectric encapsulated heater element layers, the
alternating layers of phase change material layers and
the dielectric encapsulated heater element layers are
sandwiched between a first electrode and a second
electrode; and providing a high voltage pulse to the dielectric encapsulated heater element layer to form filamentary heaters,
wherein the dielectric layer comprises a dielectric constant greater than or equal to 5.0.

18. The method according to claim 17, wherein the
alternating layers of phase change material layers and
dielectric encapsulated heater element layers are vertically
aligned.

19. The method according to claim 17, wherein the
alternating layers of phase change material layers and
dielectric encapsulated heater element layers are horizontally aligned.

\* \* \* \* \*